United States Patent
Fuseya et al.

(10) Patent No.: US 6,977,813 B2
(45) Date of Patent: Dec. 20, 2005

(54) DISK ARRAY SYSTEM

(75) Inventors: Tomokatsu Fuseya, Odawara (JP); Yuji Takei, Odawara (JP)

(73) Assignee: Hitachi, Ltd., Tokyo (JP)

( * ) Notice: Subject to any disclaimer, the term of this patent is extended or adjusted under 35 U.S.C. 154(b) by 17 days.

(21) Appl. No.: 10/876,537

(22) Filed: Jun. 28, 2004

(65) Prior Publication Data

US 2005/0243509 A1 Nov. 3, 2005

(30) Foreign Application Priority Data

Apr. 30, 2004 (JP) .............................. 2004-135977

(51) Int. Cl.$^7$ ................................................ G06F 1/20
(52) U.S. Cl. ................ 361/687; 165/80.3; 165/104.33; 454/126; 361/695
(58) Field of Search ....................................... 361/687

(56) References Cited

U.S. PATENT DOCUMENTS

| | | | |
|---|---|---|---|
| 5,812,374 A | 9/1998 | Shuff | |
| 5,930,115 A | 7/1999 | Tracy et al. | |
| 6,082,443 A | 7/2000 | Yamamoto et al. | |
| 6,269,866 B1 | 8/2001 | Yamamoto et al. | |
| 6,424,526 B1 | 7/2002 | Heard | |
| 6,459,571 B1 * | 10/2002 | Carteau | 361/684 |
| 6,826,456 B1 * | 11/2004 | Irving et al. | 361/695 |
| 6,882,536 B2 | 4/2005 | Deeney et al. | |
| 2003/0053293 A1 * | 3/2003 | Beitelmal et al. | 361/687 |
| 2003/0214781 A1 * | 11/2003 | Kolb et al. | 361/687 |
| 2004/0008484 A1 * | 1/2004 | Konshak et al. | 361/687 |
| 2004/0066621 A1 * | 4/2004 | Fairchild | 361/687 |
| 2004/0240177 A1 | 12/2004 | Suzuki et al. | |
| 2004/0264131 A1 * | 12/2004 | Nishiyama et al. | 361/694 |
| 2005/0117310 A1 | 6/2005 | Miyamoto et al. | |
| 2005/0120264 A1 | 6/2005 | Kano et al. | |

FOREIGN PATENT DOCUMENTS

JP 11-101584 9/1997

* cited by examiner

Primary Examiner—Lisa Lea-Edmonds
(74) Attorney, Agent, or Firm—Reed Smith LLP; Stanley P. Fisher, Esq.; Juan Carlos A. Marquez, Esq.

(57) ABSTRACT

In a disk array system, cooling means with a great versatility capable of efficiently performing a cooling and a heat radiation of the objects to be cooled on the circuit board in a small space and a structure capable of stably supplying the power from a DC—DC converter to the electronic components on the circuit board are provided. A circuit board is stored in a logic box in a state where a heat sink is fitted thereto, a power supply section supplies a voltage to the circuit board, and a fan is used in the ventilation for the circuit board. The circuit board has an LSI and a wiring area as the objects to be cooled. A heat sink including a base part having a flat surface to cover the whole of the objects to be cooled and radiator fins is provided. The board fitted with the heat sink is assembled in such a manner. That is, the circuit board and the heat sink are made opposed to each other and then connected with interposing the block with high thermal conductivity, which is filled depending on the height of the objects to be cooled, therebetween. Thereafter, the whole is fixed by the screws and the like.

20 Claims, 19 Drawing Sheets

FRONT SIDE

REAR SIDE

FRONT SIDE

REAR SIDE

FIG. 14

HEAT GENERATION (COOLING MEANS NOT USED)

| LSI | CONSUMPTION POWER [W] | TEMPERATURE [°C] |
|---|---|---|
| CHA | 9.4 | 93.6 |
| DKA | 9.2 | 92.2 |
| CACHE | 13.7 | 125.0 |
| SWITCH | 14.0 | 127.2 |

AMBIENT TEMPERATURE: $T_a = 25[°C]$
HEAT RESISTANCE: $\theta ja = 7.3[°C/W]$ under a US 6,977,813 B2

DISK ARRAY SYSTEM

CROSS-REFERENCE TO RELATED APPLICATION

The present application claims priority from Japanese Patent Application No. JP 2004-135977 filed on Apr. 30, 2004, the content of which is hereby incorporated by reference into this application.

TECHNICAL FIELD OF THE INVENTION

The present invention relates to a disk array system, and more particularly, it relates to a technique for cooling the components on a circuit board and to the layout of a DC—DC converter.

BACKGROUND OF THE INVENTION

In recent years, in a disk array system (referred to also as a storage system and the like), due to the trend toward faster processing in electronic components such as an LSI on a circuit board and faster data transfer between LSIs, consumption power and heat generation in electronic components such as an LSI have been increasing. Although consumption power in an LSI is about 10 to 15 W at present, if it increases to, for example, 20 to 30 W from now on, more effective means for cooling the heat (radiation) is required.

As an example of cooling means for the objects to be cooled such as electronic components on a circuit board, there is a structure in which a heat sink (radiator plate) is provided on the upper surface of each electronic component such as the LSI as the object to be cooled on a flat surface of a circuit board and by which the heat thereof is radiated. In this structure, a heat sink having a surface with almost the same size as the upper surface of the LSI as the object to be cooled is attached to the LSI. The heat sink is made of a material with high thermal conductivity (low heat resistance) and it is composed of, for example, an almost plate-shaped portion as a base part and radiator fins to enhance the radiation by air-cooling. For example, the radiator fin is composed in the following manner, that is, a plurality of cylindrical fins are provided vertically to the surface of the base part. However, this structure is not enough to deal with the increase of the heat generation due to the increase of the consumption power of the LSI, and the heat radiation of the heat sink is not sufficient.

For the improvement of the radiation efficiency by the heat sink, it is effective to enlarge a surface area of the radiator fin so as to increase the area coming in contact with the air. As a method for enlarging the surface area of the radiator fin, first, there is a method to enlarge the surface area of the base part of the heat sink so as to increase the installation area of the radiator fin. Second, there is a method to increase the height of the radiator fin itself of the heat sink.

In the case of the first method, since there are various components mounted around the LSI on the board, when the area of the base part of the heat sink attached on the upper surface of the LSI is increased, it is necessary for the heat sink not to contact the components mounted around the LSI, and therefore, it becomes difficult to mount the components around the LSI. As a result, the problem that a mounting efficiency on the board is lowered arises.

Further, in the case of the second method, a space required for the layout of the heat sink is increased, and it becomes necessary to secure a wide interval with the circuit board to be adjacently mounted in order to sufficiently secure the height of the heat sink when mounting the circuit board in a logic box of a disk array system. Consequently, the size of the logic box is increased and resulting in the increase of the size of the disk array system.

On the other hand, when there is the impedance mismatch on a data transfer path in the circuit board, a reflection noise arises. When the reflection noise arises during the high-speed data transfer, a degradation of signal occurs, and therefore, it is necessary to match a characteristic impedance of the wiring area to be a transmission path of the data transfer and an impedance in electronic components such as the LSIs on a transmission/receiver side which perform the data transfer process in order to reduce the reflection noise. Usually, though a circuit is designed so as to allow these impedances to match, the process and the burden are different between one LSI and the other LSI which perform the data transfer process. Therefore, the heat generation thereof also varies, and as a result, a difference in temperature arises on the paths during the data transfer. When a temperature difference arises between the LSI serving as the main component of the process to be the data transfer path and the wiring area to be the transmission path, the impedance is changed due to the temperature difference and the reflection noise tends to arise easily, and thus, the normal and efficient high-speed data transfer becomes difficult. With respect to this problem, since the heat sink is attached to each LSI as the object to be cooled in the above-mentioned example of the cooling means, it is not possible to reduce the temperature difference between each LSI.

As a technique for cooling the electronic components on the circuit board, a mounting structure of a plate-shaped heat pipe is disclosed in Japanese Patent Laid-Open No. 11-101584. According to this technique, the plate-shaped heat pipe is provided in opposition to the board on which a plurality of elements to be cooled are mounted. The plate-shaped heat pipe is provided with the predetermined convex portions depending on the distance with the opposite elements to be cooled and is fixed to the board by an outer frame attached to the outer peripheral portion of the plate-shaped heat pipe. The heat pipe has a working fluid sealed in a cavity portion of the plate-shaped heat pipe, and the heat is discharged by the phase transformation and the moving action of the working fluid.

SUMMARY OF THE INVENTION

In the mounting structure of the plate-shaped heat pipe, when a plurality of elements to be cooled (LSI and the like) are provided on the board, the shape of the heat pipe surface has to be designed in accordance with the different heights of each element to be cooled. Therefore, a problem of a lack of versatility arises. Further, depending on the orientation of the arranged heat pipe, there is the possibility that the cooling function cannot be fully accomplished due to the movement and deviation of the working fluid in the heat pipe cavity portion.

Further, in recent years, the power supply voltage of the LSI has been more and more reduced. Due to the reduced power supply voltage supplied to the LSI and the like, there is a merit of being able to reduce the power consumption of the LSI. However, there is also a problem that even a small voltage fluctuation which did not cause any problem in the conventional technique affects the operation of the LSI. When using a long power supply path, the influence of electromagnetic noises from the outside is increased and it becomes impossible to stably supply a voltage. Consequently, it is necessary to install a DC—DC converter in the vicinity of the LSI to which the power is supplied so as to shorten a power supply path. However, since the DC—DC converter itself becomes the generating source of the electromagnetic noise, the signal in the wiring directly below the DC—DC converter is affected by the influence of the electromagnetic noise generated by the DC—DC converter, and the transfer signal is degraded. Consequently, it is difficult to install the DC—DC converter in the vicinity of the LSI on which the board wirings are concentrated.

The present invention has been made in view of the above-described problems, and a first object of the invention is to provide a disk array system provided with cooling means with a great versatility which can be adapted to various circuit board structures, by which a cooling and a heat radiation of the circuit board having the objects to be cooled such as electronic components with high heat generation can be efficiently performed, a cooling and a heat radiation can be performed in a small space without lowering a mounting efficiency in the circuit board, and a high-speed data transfer can be stable executed by reducing the reflection noise due to the impedance mismatch in the data transfer paths.

Also, a second object of the invention is to provide a disk array system, which can perform a stable power supply from the DC—DC converter to electronic components such as the LSI on the circuit board.

Among the inventions disclosed in this application, the outline of the representative invention will be simply described as follows.

(1) To achieve the above-described objects, the disk array system of the present invention is a disk array system comprising: a controller having a plurality of circuit boards including a channel adaptor board, a switchboard, a cache board, and disk adaptor board; a disk device controlled by the controller; a power supply section to supply a power to the circuit board; and a fan for the ventilation in the system, wherein the circuit board has the objects to be cooled including an electronic component or a wiring area or both of them thereon and is stored in the logic box in a state of being fitted with the heat sink with interposing a block with high thermal conductivity therebetween, and the heat sink has a base part having a connection flat surface which covers the whole upper surfaces of the objects to be cooled and radiator fins, and the block has a shape coming in contact with the upper surfaces of the objects to be cooled on the circuit board and the connection flat surface of the heat sink and transmits the heat of the objects to be cooled to the heat sink side.

In the above-described structure, the circuit board having the objects to be cooled is stored in the logic box in a state of being fitted with the heat sink. This board fitted with the heat sink is composed in the following manner, that is, one circuit board having one or more objects to be cooled is connected to one heat sink with interposing the block therebetween. In this way, the whole of one or more objects to be cooled on the circuit board is connected to the connection flat surface through the block. The heat is transmitted from the objects to be cooled including integrated circuit parts such as the LSI and the wiring to the heat sink through the block, and the heat is discharged by the radiator fins.

(2) Further, the disk array system of the present invention according to the above-described (1) disk array system is characterized in that two circuit boards are paired and the flat surfaces on the side having the objects to be cooled of the paired circuit boards are opposed to each other, and one or plural blocks with high thermal conductivity and one heat sink are interposed between the boards, and in this state, the boards are stored in the logic box, and the heat sink has two base parts having the connection flat surface for connecting a pair of circuit boards and radiator fins, and a first block having a shape connected to the upper surface of the objects to be cooled on a first circuit board and a first connection flat surface and a second block having a shape connected to the upper surface of the objects to be cooled on a second circuit board and a second connection flat surface are provided as the above-described blocks.

In the above-described structure, a plurality of objects to be cooled on the two circuit boards are cooled by a single heat sink. In this way, a difference in heat between a plurality of objects to be cooled, for example, electronic components such as the LSI which perform a high-speed data transfer process and the wiring area connected thereto is absorbed by the heat sink, thereby the temperature difference is reduced.

(3) Further, the disk array system of the present invention according to the above-described (1) disk array system is characterized in that it has a DC—DC converter to perform power supply to the electronic components on the circuit board, and the DC—DC converter is installed on the connection flat surface of the heat sink in the vicinity of the electronic components as the power supply targets in a state where it is separated from the flat surface of the circuit board, and the power is supplied from the DC—DC converter to the electronic components through the wiring in a power supply plane of the circuit board.

In the above-described structure, the objects to be cooled on the circuit board are collectively cooled by the heat sink, and at the same time, the power is supplied to integrated circuit parts such as the LSI through the power supply line from the DC—DC converter connected to the connection flat surface on the circuit board side of the heat sink.

(4) Further, the disk array system of the present invention according to the above-described (1) disk array system is characterized in that it has a DC—DC converter to perform power supply to the electronic components on the circuit board, and the DC—DC converter is installed on the surface on a side opposite to the connection flat surface of the base part of the heat sink in the vicinity of the electronic components as the power supply targets, and the power is supplied to the electronic components from the DC—DC converter through the openings provided in the heat sink and the power supply line.

The objects to be cooled on the circuit board are collectively cooled by the heat sink, and at the same time, the power is supplied to the LSI from the DC—DC converter connected on the surface on a side opposite to the connection flat surface of the heat sink without using the wiring of the power supply plane.

(5) Further, the disk array system of the present invention according to the above-described (2) disk array system is characterized in that it has a DC—DC converter to perform power supply to the two electronic components which are opposed with interposing the heat sink therebetween in one pair of circuit boards, and the DC—DC converter is installed in the installing area of the radiator fin of the heat sink in the vicinity of the two electronic components as the power supply targets, and the power is supplied to the two electronic components from the DC—DC converter through the openings respectively provided in the two base parts of the heat sink and the power supply line.

In the above-described structure, the objects to be cooled on the two circuit boards are collectively cooled, and at the same time, the power is supplied to two LSIs from the DC—DC converter arranged in the area for the radiator fin of the heat sink through the wiring at almost equal voltage.

Among the inventions disclosed in this application, the advantages obtained from the representative invention will be simply described as follows.

According to the present invention, as a first advantage, a cooling and a radiation can be efficiently performed for the circuit board having the objects to be cooled such as the electronic components with high heat generation, and the cooling and the radiation can be performed in a small space without lowering a mounting efficiency in the circuit board, and a high-speed data transfer can be stably executed by reducing the reflection noise due to impedance mismatch of the data transfer paths, and it has the great versatility and can be adapted to various circuit board structures.

Further, as a second advantage, a power is stably supplied to electronic components such as the LSI on the circuit boards from the DC—DC converter.

BRIEF DESCRIPTIONS OF THE DRAWINGS

FIG. 14 is a table showing a heat generation (assessed value) by means of consumption power and temperature in the LSI on each circuit board in a state where cooling means such as the heat sink is not used in the disk array system according to an embodiment of the present invention;

DESCRIPTIONS OF THE PREFERRED EMBODIMENTS

Hereinafter, embodiments of the present invention will be described in detail with reference to the drawings. Note that, the components with the same function are denoted by the same reference symbols in all the drawings to explain the embodiments and repetitive explanation thereof will be omitted.

A disk array system in the embodiment of the present invention has a structure for efficiently cooling the objects to be cooled such as electronic components and wiring areas on a circuit board which become constituent elements of the system. Further, in relation to the structure for cooling, the system has a structure regarding the layout of a DC—DC converter for performing a stable power supply to the electronic components on the circuit board. Prior to the description thereof, the structure of a disk array system 1 to be a common structure in the disk array systems in each embodiment of the present invention will be described.

<Hardware Structure of Disk Array System>

Figure 1A:
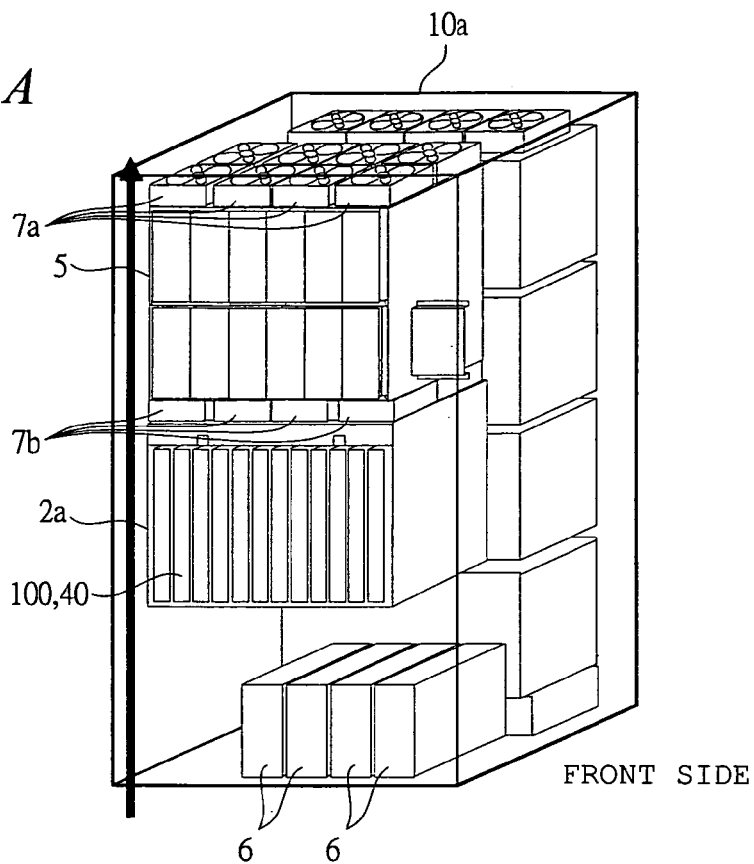
FIG. 1A is a diagram showing an external hardware structure of a disk array system to be a common structure in the disk array systems in each embodiment of the present invention, and particularly showing a first housing structure.
Figure 1B:
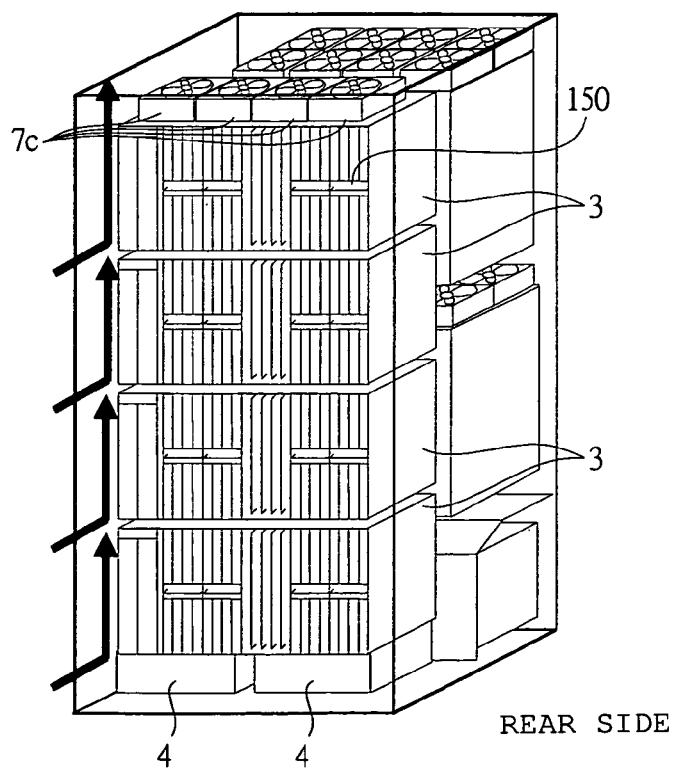
FIG. 1B is a diagram showing an external hardware structure of a disk array system to be a common structure in the disk array systems in each embodiment of the present invention, and particularly showing a first housing structure.

First, a hardware structure of the disk array system 1 will be described. FIG. 1 is shows external hardware structure of the disk array system 1. FIG. 1A is a perspective view seen from the front of the disk array system 1, and FIG. 1B is a perspective view seen from the back of the disk array system 1. These drawings show the internal structure of the system through the housing. The arrows in the drawings represent the airflow.

The inside of a housing 10a of the disk array system 1 includes a logic box 2 (particularly 2a), a HDD box 3, an AC power supply 4, a power supply section 5, a battery 6, and a fan 7 (particularly, 7a, 7b, and 7c).

The housing 10a is provided with openings (not shown) of the predetermined shape for the ventilation of the air to perform the cooling of each portion in the housing 10a by the airflow by the operation of the fan 7. The structure shown in FIG. 1 is an example for the openings. According to the structure in this example (hereinafter referred to as first housing structure), the openings are formed in the upper surface, the bottom surface and the back surface of the housing 10a.

The logic box 2a is a unit, into which a circuit board 100 constituting a controller of the disk array system 1 (disk system controller) is installed and stored. When installing and storing the circuit board 100 into the logic box 2a, the circuit board 100 is installed and stored in the form of a circuit board 40 fitted with a heat sink which is obtained by attaching the heat sinks (30a, 30b, and the like) described later to the circuit board 100 having the objects to be cooled. Depending on a throughput and a redundant structure, a plurality of circuit boards 100 are installed.

The HDD box 3 is a unit capable of storing a plurality of disk devices (hard disk drive) 150. The data read/write and the like to the disk device 150 are controlled by the controller of the disk array system 1. Further, the RAID control particularly for a plurality of disk devices 150 is performed by the controller of the disk array system 1.

The disk array system 1 has the AC power supply 4, the power supply section 5, and the battery 6 as a power supply unit. The AC power supply 4 is a unit, which is a source to supply the power to each portion in the disk array system 1. A power supply common bus (not shown) is connected to the AC power supply 4. The power supply common bus is a bus which is commonly used for the power supply to each portion in the disk array system 1.

The power supply section 5 is a power supply unit to perform the power supply particularly to the logic box 2a in the disk array system 1. The power supply section 5 is connected to the power supply common bus and power is supplied from the AC power supply 4. The power supply/ ground wiring for providing a direct current power to each circuit board 100 connected into the logic box 2a is connected from the power supply section 5 to the power supply input terminal of a back plane 21 in the logic box 2a. In the circuit board 100 connected to the back plane 21, the power is supplied to each electronic component mounted on the circuit board 100 through the power supply/ground wiring from the power supply section 5 to the back plane 21 and the power supply/ground wiring in a power supply plane of each circuit board 100 (plane portion of a board in which power supply lines are mounted).

The battery 6 is a unit provided to continue the operation of the disk array system 1 even when the normal power supply, that is, the AC power supply 4 is stopped. The battery 6 is also connected to the power supply common bus, and when the normal power supply is stopped, the unit supplies the power to the power supply section 5 and other portions.

The fans 7a and 7b are arranged at the front side in the housing 10a, and the ventilation is performed mainly for the power supply section 5 and the logic box 2a by the operation thereof. The fan 7a is installed on the top of the power supply section 5, and the fan 7b is installed on the opening in the upper surface of the logic box 2a. Further, the fan 7c is arranged at the backside in the housing 10a, and the ventilation is performed mainly for the HDD box 3 by the operation thereof. In this case, the fan 7c is installed particularly at the top the uppermost HDD box 3 of a plurality of HDD boxes 3. The layout of each fan 7 in the disk array system 1 shown in FIG. 1 is merely an example, and each fan may be installed at a different place, and further, a more number of fans may be installed at other places.

The main airflow in the disk array system 1 in the first housing structure will be described as follows. That is, as shown in FIG. 1A, the air flows in through the opening in the bottom surface of the housing 10a and is discharged through the opening in the upper surface of the housing 10a via the inside of the logic box 2a, the fan 7b, the inside of the power supply section 5, and the fan 7a. Further, as shown in FIG. 1B, the air flows in through the opening in the back surface of the housing 10a and is discharged through the opening in the upper surface of the housing 10a via the inside of each HDD box 3 and the fan 7a.

Figure 2A:
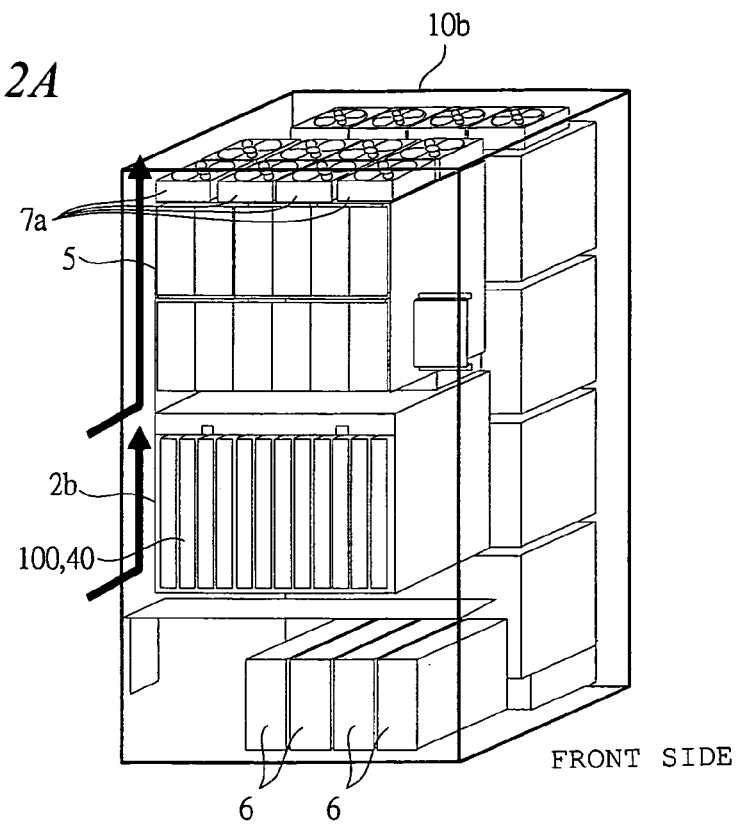
FIG. 2A is a diagram showing an external hardware structure of a disk array system to be a common structure in the disk array systems in each embodiment of the present invention, and particularly showing a second housing structure.
Figure 2B:
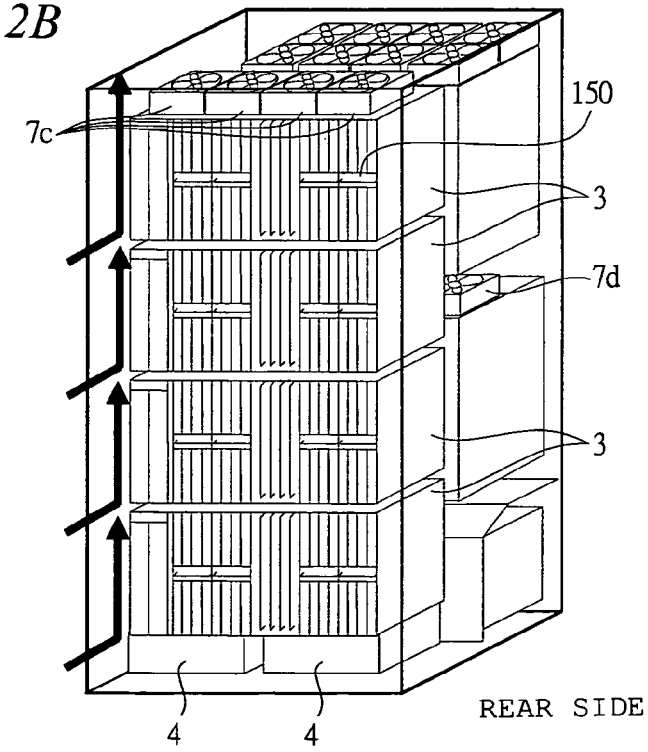
FIG. 2B is a diagram showing an external hardware structure of a disk array system to be a common structure in the disk array systems in each embodiment of the present invention, and particularly showing a second housing structure.

Further, FIG. 2 shows another example (referred to as the second housing structure) related to the opening and the airflow. With regard to this example, FIG. 2A is a perspective view seen from the front of the disk array system 1, and FIG. 2B is a perspective view seen from the back of the disk array system 1. These drawings show the internal structure of the system through the housing. In this example, the openings are formed in the upper surface, the front surface and the back surface of the housing 10b of the disk array system 1. The structure of each portion in the housing 10b is almost identical to that of the first housing structure, and the airflow for cooling and radiating the circuit board 100 is different. The second housing structure includes particularly a logic box 2b as the logic box 2. Although only a part thereof can be seen in the drawing, the fan 7d is installed on the backside opening in the upper portion of the logic box 2b.

The main airflow in the disk array system 1 in the second housing structure will be described as follows. That is, as shown in FIG. 2A, the air flows in through the opening in the front surface of the housing 10b and is discharged through the opening in the upper surface of the housing 10b via the inside of the logic box 2b, the fan 7d, the inside of the power supply section 5, and the fan 7a. Further, as shown in FIG. 2B, the air flows in through the back surface of the housing 10b and is discharged through the opening in the upper surface of the housing 10b via the inside of each HDD box 3 and the fan 7c.

Note that, though only one example with regard to the layout of each portion in the disk array system 1 is shown in this embodiment, other structures to arrange each portion is also available depending on the design for the airflow.

The logic box 2 has an opening for the ventilation of the air, and the air inside the logic box 2 is discharged by the operation of the fan 7. Various types of input-output terminals and wirings are provided in a back plane (back surface portion, not shown) 21 of the logic box 2. The circuit board 100 is connected to a corresponding portion of the back plane 21 by a back plane connector 22 provided on one side of the circuit board 100. Through the wirings in the back plane 21, different circuit boards 100 are mutually connected so that the data transfer process and the like can be performed. Further, through the wirings in the back plane 21, the circuit board 100 and the disk device 150 and the like in the disk array system 1 are connected.

A plurality of circuit boards 100 are stored in the logic box 2. The circuit board 100 having the object to be cooled is stored in the logic box 2 in the form of a board 40 fitted with a heat sink. The board 40 fitted with the heat sink is inserted from the front of the logic box 2 by a worker and is set to the predetermined position so as to be in a connected state. The board 40 fitted with the heat sink is obtained by connecting and fixing the heat sinks (30a, 30b and the like) and other parts to the circuit board 100.

In the embodiment of the present invention, the circuit board 100 in the form of the board 40 fitted with the heat sink is vertically set into the logic box 2. For the efficient cooling and radiation of the circuit board 100, the airflow path and the orientation of the arranged circuit board 100 in the disk array system 1 are designed such that the air flows in parallel to the circuit board 100 and the flat surface of the heat sink within the logic box 2.

<Functional Block Structure of Disk array system>

Figure 3:
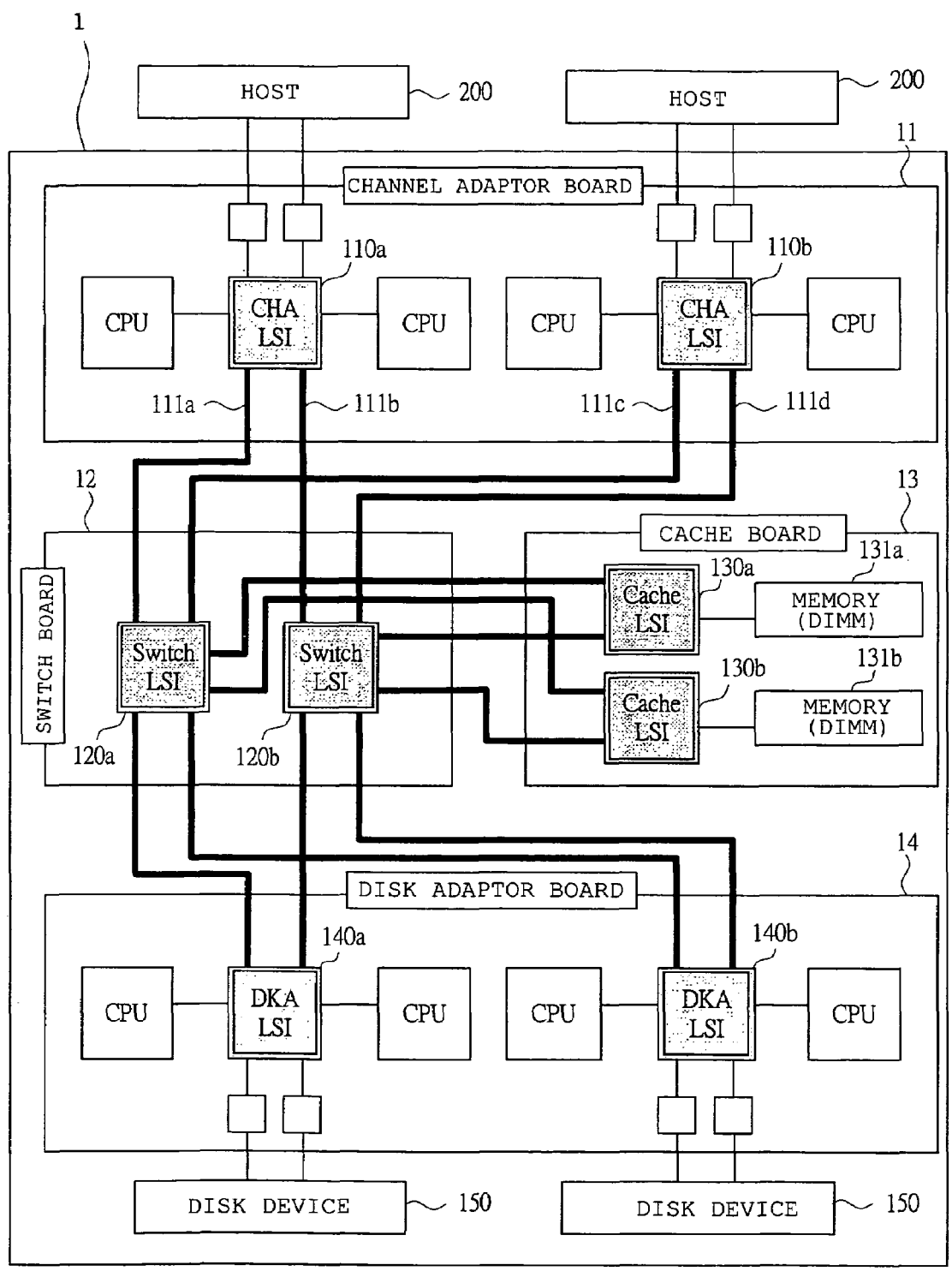
FIG. 3 is a diagram mainly showing a functional block structure of the controller in the disk array system to be a common structure in the disk array systems in each embodiment of the present invention.

Next, a functional block structure of the disk array system 1 will be described. FIG. 3 is a diagram mainly showing a functional block structure of the controller of the disk array system 1. The disk array system 1 is mainly composed of a controller (disk device controller) and one or more disk devices 150. The controller is formed by connecting a plurality of circuit boards 100 and performs the control of the whole disk array system 1 including the control of the disk device 150. The controller performs the control of the data read/write and the like for the disk device 150 based on a command from a host 200 using the disk array system 1. Further, the controller can perform the RAID control for a plurality of disk devices 150.

The host (host computer) 200 is connected to the disk array system 1 through predetermined communication means and a connection path. Though an example of two hosts are connected is shown here, it is possible to connect a plurality of hosts and, moreover, other disk array systems and the like. The host 200 is various computers such as PC, a server, a mainframe computer, and the like. The host 200 issues an access command to the disk array system 1 through communication means and performs a read/write of the data stored in a memory area provided by the disk device 150.

In the disk array system 1, one or more disk devices 150 are connected to the controller through a connecting line. Though an example in which two disk devices are connected is shown here, it is also possible to provide a RAID function by connecting a number of the disk devices.

As the circuit board 100 constituting the controller, the disk array system 1 has a channel adaptor (CHA) board 11, a switch board 12, a cache board 13, and a disk adaptor (DKA) board 14 for each function. A plurality of these circuit boards 100 can be installed and operated depending on the structure of the disk array system 1. In the case of this embodiment, a plurality of the circuit boards 100 (11 to 14) of each type should be provided. Note that, the disk array system 1 is also provided with a processor for the maintenance and management of the ventilation by the fan 7 and the power supply by the power supply section 5 in relation to the above-described drawings.

The CHA board 11 is a circuit board 100 having a function as a CHA which mainly controls the data transfer between the host 200 and the cache memory in the cache board 13. Particularly, the CHA board 11 has CHA LSIs 110a and 110b as electronic components mounted on the board thereof. The CHA LSIs 110a and 110b are semiconductor integrated circuits (chips) to perform a high-speed data transfer process. The CHA LSIs 110a and 110b perform the high-speed data transfer particularly with other LSIs through wirings 111a to 111d. Therefore, the CHA LSIs 110a and 110b have larger power consumption and higher heat generation in comparison with other electronic components mounted on the CHA board 11.

In this embodiment, electronic components with high heat generation due to the high-speed data transfer process such as the CHA LSIs 110a and 110b are taken as the objects to be cooled. The CHA board 11 has various electronic components other than the CHA LSIs 110a and 110b. For example, a CPU is connected adjacent to the CHA LSIs 110a and 110b. Since this CPU does not perform the high-speed data transfer process, its heat generation is relatively low. Consequently, the CPU is not taken as the object to be cooled. In the drawings, the illustration of other electronic components on the circuit board 100 which are not taken as the objects to be cooled are omitted.

Further, this embodiment shows the case where two CHA LSIs 110a and 110b are provided on one CHA board 11. Not limited to this case, even in the case where one or more electronic components such as LSIs are mounted on the circuit board 100, the parts with higher heat generation, that is, those having higher temperature are taken as the objects to be cooled.

The switch board 12 is a circuit board 100, which has a function as a switch to mutually connect the cache memory, the CHA, and the disk adaptor (DKA) and perform the data transfer process among them. The switch board 12 particularly mounts two switch LSIs 120a and 120b serving as the switches on the board as the electronic components to perform the high-speed data transfer process. The switch LSIs 120a and 120b perform the high-speed data transfer process through the wirings between other LSIs. Note that only the wirings between the CHA board 11 and the switch board 12 are denoted by reference numerals. For example, the switch LSI 120a performs the high-speed data transfer process between the CHA LSIs 110a and 110b through the wirings 111a and 111c.

The cache board 13 is a circuit board 100 which is located between the CHA and the DKA, is connected to the switch through the wirings, and has a function as a cache memory. The cache memory is provided to perform the read/write process of data for the disk device 150 in asynchronous with the disk device 150. The cache board 13 mounts two Cache LSIs 130a and 130b on the board as the electronic components to perform the high-speed data transfer process with the switches. Further, as a memory device constituting the cache memory, memories (DIMM) 131a and 131b are connected to the cache LSIs 130a and 130b, and the data read/write process is performed by the cache LSIs 130a and 130b.

The DKA board 14 is a circuit board 100, which controls the data transfer between the cache memory and the disk device 150 and has a function as a DKA to perform the control of the data read/write for the disk device 150. The DKA board 14 is connected to the switches through the wirings and is connected to the disk device 150 through the connecting line. The DKA board 14 mounts two DKA LSIs 140a and 140b on the board as the electronic components to perform the high-speed data transfer process with the switches.

Each LSI (110a, 120a, 130a, 140a and others) enclosed by a double line in FIG. 3 is the electronic component as the object to be cooled in this embodiment. Further, with regard to the data transfer process between the electronic components, the wirings shown by a heavy line also become the objects to be cooled. With regard to the wirings, for example, the wiring area in which the wirings 111a to 111d are mounted on the circuit board 100 is taken as the area to be connected to the heat sinks (30a, 30b and the like).

<Data Processing Between Host and Disk Array System>

The outline of the data processing between the host 200 and the disk array system 1 will be described with reference to FIG. 3. First, a data read operation from the host 200 to the disk array system 1 will be described. After the CHA of the disk array system 1 receives a data read command from the host 200 and when the data concerned is on the cache memory, the data concerned on the cache memory is read from the CHA through the switch and the data is transmitted to the host 200 as a response. Further, when the data is not on the cache memory, the data concerned is read from the memory area of the disk device 150 through the switch and the DKA and the data is written on the cache memory. Thereafter, the CHA reads the data from the cache memory through the switch and the data is transmitted to the host 200 as a response.

Next, a data write operation from the host 200 to the disk array system 1 will be described. After the CHA of the disk array system 1 receives a data write command and the write data concerned from the host 200, the data is written in the cache memory through the switch. Thereafter, the DKA writes the data written in the cache memory in the disk device 150 through the switch.

<Hardware Structure of Circuit Board and Objects to be Cooled>

Figure 4:
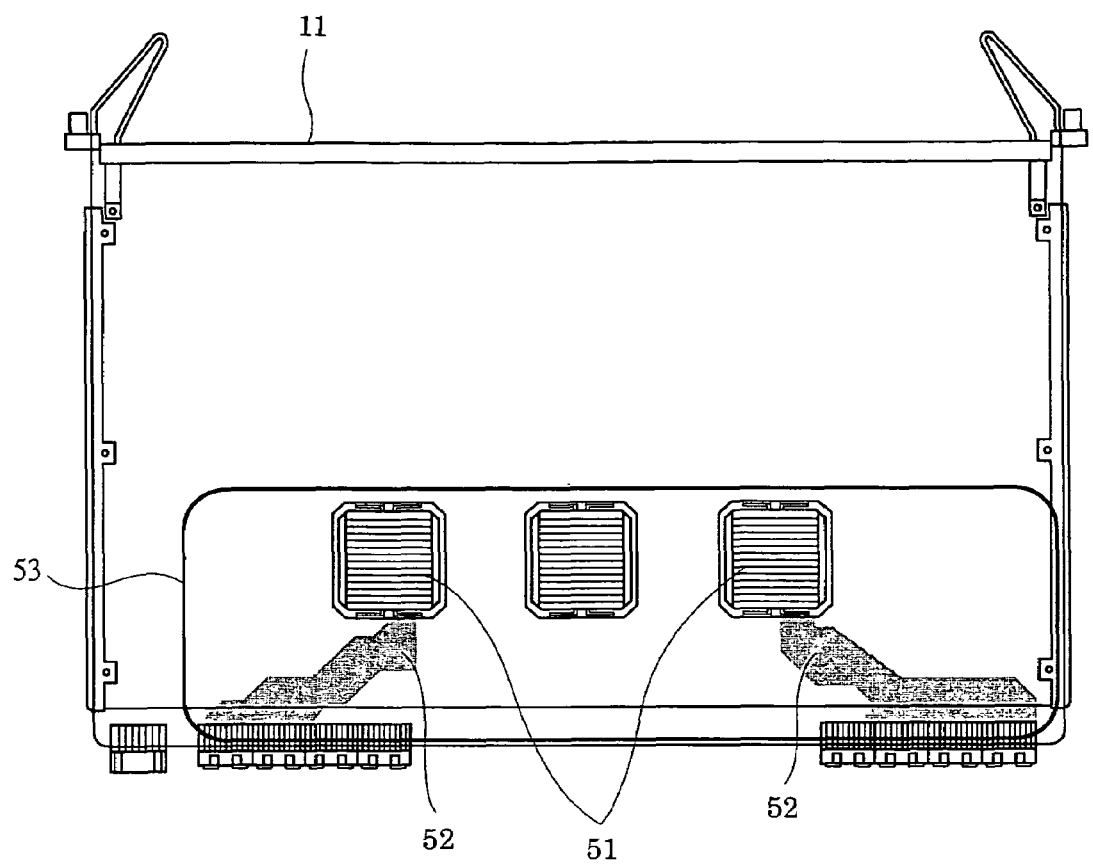
FIG. 4 is a schematic diagram showing an external hardware structure of a channel adaptor board and the objects to be cooled in the disk array system to be a common structure in the disk array systems in each embodiment of the present invention.
Figure 5:
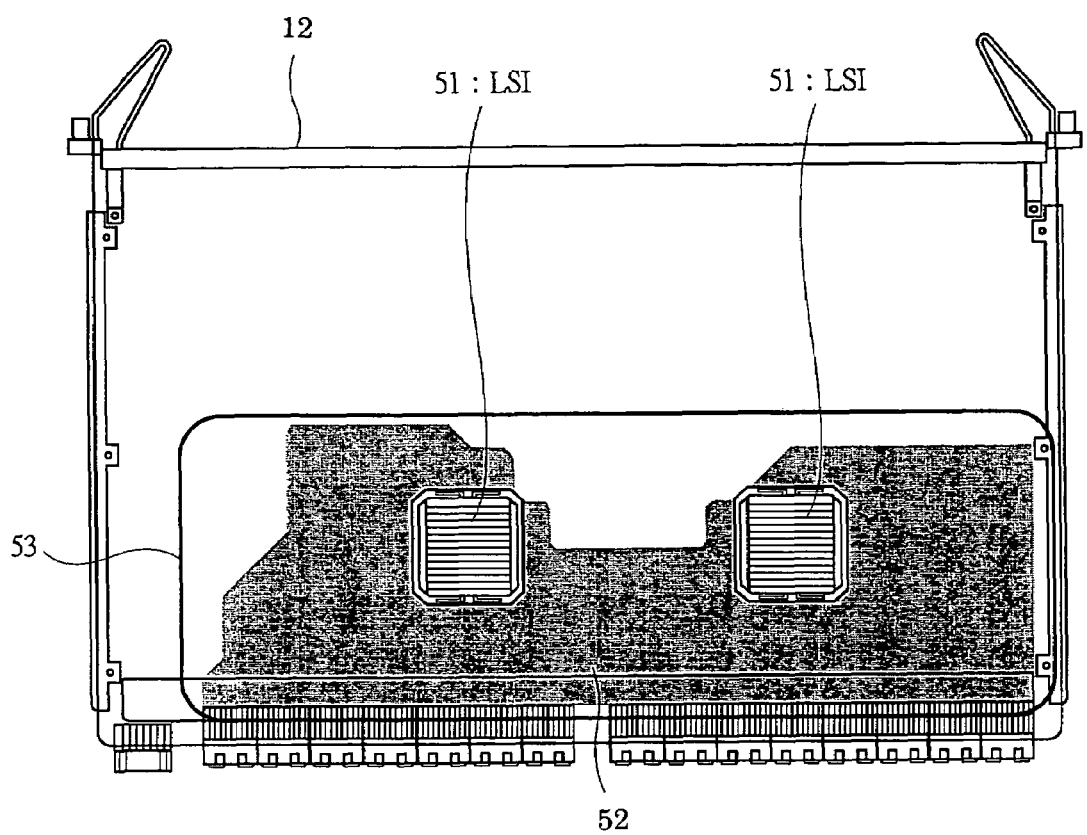
FIG. 5 is a schematic diagram showing an external hardware structure of a switch board and the objects to be cooled in the disk array system to be a common structure in the disk array systems in each embodiment of the present invention.

Next, the hardware structure and the object to be cooled on the circuit board 100 which are the constituent elements of the disk array system 1 will be described. As an example of the circuit board 100, the hardware structures of the CHA board 11 and the switch board 12 are shown. FIG. 4 is a schematic diagram showing the external hardware structure and the objects to be cooled of the CHA board 11. Further, FIG. 5 is a schematic diagram showing the external hardware structure and the objects to be cooled of the switch board 12. One or more electronic components as the objects to be cooled such as LSIs 51 (semiconductor integrated circuit) and various elements as the objects to be cooled including a wiring area 52 composed of the wirings connected to the electronic components are mounted on each circuit board 100.

In this embodiment, the object to be cooled, that is, a part to which a heat sink (30a, 30b and the like) is mounted is classified into two types such as an LSI 51 and the wiring area 52 on the circuit board 100. The LSI 51 as the object to be cooled is an electronic component whose heat generation is high and temperature is easily increased because it performs a high-speed operation and high-speed process on a circuit board 100 such as the CHA LSI 110a. The wiring area 52 as the object to be cooled is a part of the wiring, which is connected to the LSI 51 as the object to be cooled on the circuit board 100 and functions as a transmission path to transfer a high-speed signal, and whose temperature is easily increased by the influence of the high heat generation of the LSI 51 which performs the high-speed data transfer process. Further, a rectangular area denoted by the reference numeral 53 shows the minimum cooled area on the circuit board 100. This minimum cooled area 53 is an area which includes all of a plurality of objects to be cooled and has an optional shape (a rectangular shape in this case) with a size capable of covering all upper surfaces of a plurality of the objects to be cooled. The heat sink has a connection flat surface with the size larger than the minimum cooled area 53.

In the channel adaptor 11 in FIG. 4, the LSIs 51 as the objects to be cooled are the CHA LSIs 110a and 110b. The CHA LSIs 110a and 110b are provided in the form of a package having the predetermined height and an almost square upper flat surface and are mounted on the board. The wiring areas 52 as the objects to be cooled represented by hatched lines are areas composed of a set of wirings connected to the LSIs 51 as the objects to be cooled on the board and correspond to a mounting portion of the wirings 111a to 111d on the CHA board 11. The wiring areas 52 as the objects to be cooled are areas to be transmission paths in the high-speed data transfer with other LSIs 51 as the objects to be cooled on other circuit board 100. The wiring of the wiring area 52 is connected to the back plane 21 of the logic box 2 and is connected through the wirings of the back plane 21 to wirings such as the wiring area 52 as the object to be cooled on other circuit boards 100.

In the switchboard 12 in FIG. 5, the LSIs 51 as the objects to be cooled are the switch LSIs 120a and 120b. The switch LSIs 120a and 120b are provided in the form of a package having the predetermined height and an almost square upper flat surface and are mounted on the board. The wiring area 52 as the object to be cooled represented by hatched lines is an area composed of the wirings connected to the LSI 51 as the object to be cooled on the board and corresponds to a number of wiring portions of the wirings 111a to 111d including the mounting portion on the switch board 12. The wiring area 52 is an area to be a transmission path in the high-speed data transfer with other LSIs 51 as the objects to be cooled on other circuit boards 100.

The high-speed data transfer process is performed between the CHA board 11 and the switch board 12 having the external hardware structure shown in FIGS. 4 and 5, with using the LSI among the LSIs 51 as the objects to be cooled as a main part in the data transfer process and using the wirings in the wiring area 52 as the object to be cooled as the transmission path. For example, the high-speed data transfer process is performed between the CHA LSI 110a and the switch LSI 120a with using the wiring 111a as the transmission path. The same thing is true in the cache board 13 and the DKA board 14.

Further, the example shown in FIG. 3 is the case where the data transfer is not performed between a plurality of LSIs 51 as the objects to be cooled on the same circuit board 100. However, even in the case where the data transfer process is performed between a plurality of LSIs 51 as the objects to be cooled on the same circuit board 100 through the wirings connecting them, the set of these components can be taken as the object to be cooled.

DESCRIPTION OF THE PREFERRED EMBODIMENTS

First Embodiment

Figure 6:
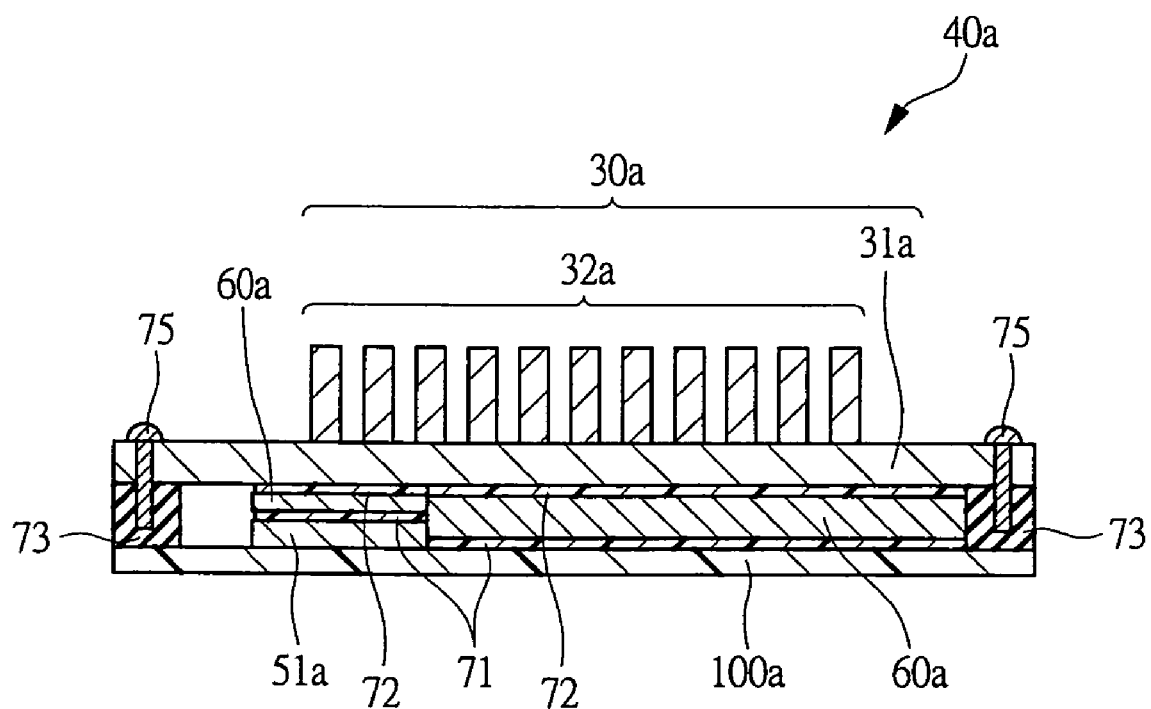
FIG. 6 is a sectional view of a board fitted with a heat sink in the disk array system according to the first embodiment of the present invention.
Figure 7:
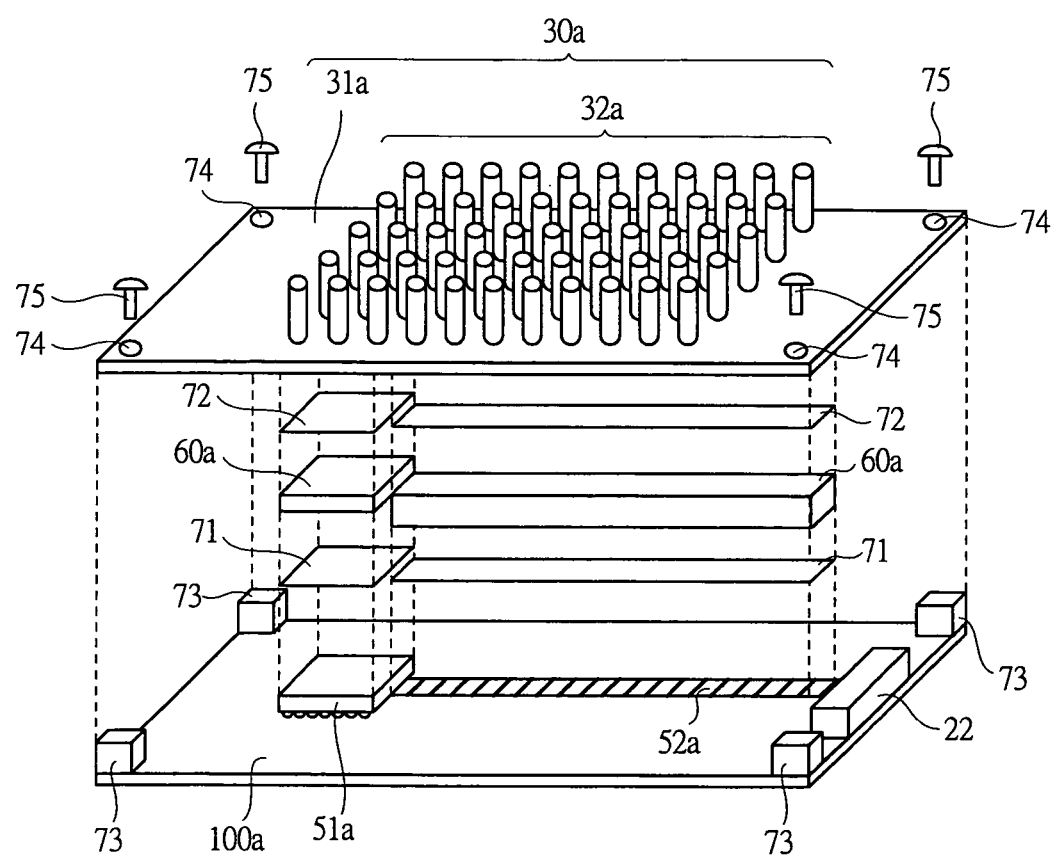
FIG. 7 is a perspective view showing a disassembled state of the board fitted with the heat sink in the disk array system according to the fist embodiment of the present invention.

A disk array system according to a first embodiment of the present invention will be described. FIG. 6 is a sectional view of a board 40 fitted with a heat sink in the disk array system according to the first embodiment. Further, FIG. 7 is a perspective view showing a disassembled state of the board 40 fitted with the heat sink in the disk array system according to the first embodiment. The basic structure of the disk array system according to the first embodiment corresponds to the structure of the above-described disk array system 1.

In the first embodiment, the board 40a fitted with the heat sink is composed in the following manner, that is, one heat sink 30a is connected to one circuit board 100a having a plurality of objects to be cooled with interposing a block 60a with high thermal conductivity therebetween, and the whole body is fixed.

In FIGS. 6 and 7, the board 40a fitted with the heat sink is mainly composed of a circuit board 100a, a heat sink 30a, and a block (heat sink connecting block) 60a. Further, as a part or members to connect and fix them, the board 40a fitted with the heat sink has a thermal conduction sheet 71, a double-faced tape (low heat resistance double-faced tape) 72, a heat sink fixtures (screw support) 73, screw holes 74, screws 75 and the like.

One or more LSIs 51a and one or more wiring areas 52a as the objects to be cooled are mounted on the circuit board 100a. The LSI 51a is an electronic component for performing the high-speed transfer process, and the wiring area 52a composed of the wirings to be the transmission paths of a high-speed signal are connected to the LSI 51a. The wiring area 52 is connected to the back plane connector 22 and is further connected to electronic components such as the LSI and the like on other circuit boards 100 through the wirings in the back plane 21. Note that, an example in which only one LSI 51a and only one wiring area as the objects to be cooled are mounted on the circuit board 100a is shown in FIGS. 6 and 7, and the illustration of other electronic components, wirings and the like not to be cooled is omitted. Even in the case where a plurality of LSIs 51a and a plurality of wiring areas 52a are mounted on the circuit board 100a, a single heat sink 30a is connected to those parts as a set of the objects to be cooled.

The heat sink fixtures 73 are provided in the outer periphery of the circuit board 100a. The heat sink fixture 73 may be formed as a part of the circuit board 100a or may be connected to the circuit board 100a as a separate part afterward. In this case, particularly, the heat sink fixtures 73 are provided at the four corners of the outer periphery of the circuit board 10a.

The heat sink (radiator plate) 30a is a part for cooling the LSI 51a and the wiring area 52a as the objects to be cooled on the circuit board 100a. The heat sink 30a has a base part 31a and radiator fins 32a and is made of such materials as aluminum and copper with high thermal conductivity (low heat resistance). The base part 31a is a portion with an almost flat plate shape and one flat surface (lower flat surface in the drawing) is used as a connection flat surface with the circuit board 100a. The screw holes 74 are provided in the base part 31a particularly at the four corners of the outer periphery of the base part 31a. The radiator fin 32a is a portion formed as an integrated part of the base part 31a. The radiator fin 32a is composed of a plurality of almost cylindrical fins arranged vertically from one flat surface of the base part 31a in a matrix manner. The shape of the radiator fin shown here is merely one example and other shapes are also available. The radiation is enhanced by the air-cooling by the air flown through the area of the radiator fin 32a.

The positions of the heat sink fixtures 73 on the circuit board 100a and the screw holes 74 in the heat sink 30a are located in the outer peripheral portion thereof in which the wiring area and the like of the wiring board 100a are not provided, particularly, at the four corners thereof so as not to hinder the mounting of the parts and the wirings on the circuit board 100a.

When fixing the circuit board 100a and the heat sink 30a, the lower flat surface of the heat sink 30a and the upper flat surface (the surface having the objects to be cooled) of the circuit board 10a are opposed to each other, and the block 60a located on the objects to be cooled on the circuit board 100a is interposed between the circuit board 100a and the heat sink 30a. In this state, the circuit board 100a and the heat sink 30a are fixed by the heat sink fixture 73, the screw holes 74 and the screws 75 and the like.

The height of the objects to be cooled (the LSI 51a and the wiring area 52a) on the circuit board 100a is not uniform. Therefore, the block 60a is interposed and connected between the objects to be cooled and the base part 31a of the heat sink 30a. In this way, the space is filled (buried) with the solid block 60a and the difference in height of the objects to be cooled is compensated, and in this manner, the heat is moved from the objects to be cooled to the heat sink 30a. In this example of the filling and the connection by the block 60a, two blocks such as a block having the size corresponding to the LSI 51a and a block having the size corresponding to the wiring area 52 are used.

The block 60a is made of materials with high thermal conductivity such as aluminum and copper. The height of the block 60a is designed to match with the length between the upper flat surface of the objects to be cooled to be the connection flat surface and the lower flat surface of the base part 31a of the heat sink 30a. The shape of the block 60a in the direction of the board flat surface is almost the same as the upper flat surface of the object to be cooled. By using a plurality of blocks 60a for a plurality of objects to be cooled, the height of the heat sink connection is adjusted. In this example, two blocks 60a are used for the two objects to be cooled (51a and 51b) to adjust the height. The block 60a connected on the LSI 51a is a plate-shaped rectangular solid having a square flat surface and a size corresponding to that of the upper surface of the LSI 51a. The block 60a connected on the wiring area 52a is a bar-shaped rectangular solid having a rectangular flat surface and a size corresponding to that of the upper surface of the wiring area 52a. By the adjustment by each block 60a, the height of the LSI 51a and the block 60a connected thereon becomes equal to the height of the wiring area 52a and the block 60a connected thereon.

Further, for example, the shape of the block 60a in the direction of the board flat surface may be an optional shape having a larger size than that capable of covering the whole objects to be cooled. Further, it is also possible to use a smaller number of blocks 60a than the objects to be cooled or a single block 60a to adjust the height of the heat sink even when there are a plurality of objects to be cooled.

The layout of the block 60a is determined depending on the layout and the shape of the objects to be cooled on the circuit board 10a, and the objects to be cooled and the heat sink 30a are thermally connected through the heat conductive block 60a and other parts.

Further, various types and a number of unit blocks having the predetermined shape are prepared in advance as the block 60a, and the connection between the objects to be cooled and the heat sink 30a is made by combining these unit blocks. As the unit block, the rectangular or plate-shaped blocks having the predetermined size and the blocks in which the shape of the upper surface is square or right triangle are prepared. These unit blocks are combined and arranged on the objects to be cooled and then connected. For example, as the block 60a, a block having a square flat surface 4 cm on a side is prepared, and this block is arranged and connected on the LSI 51a having the upper surface with the same size as this block. Further, a plurality of blocks having a square flat surface or a right triangle flat surface 1 cm on a side are prepared, and these blocks are combined so as to match with the shape of the wiring area 52 and then arranged and connected on the wiring area 52. Also in the case where the area of the wiring 52a is wide, these units are combined and arranged. Naturally, only the single unit part with a shape matched with the length between the upper flat surface of the object to be cooled and the lower flat surface of the base part 31a of the heat sink 30 can be used as the block 60a in this connection.

When the lower surface of the block 60a and the upper surfaces of the objects to be cooled 51a and 51b are connected, the thermal conduction sheet 71 is interposed therebetween. Further, when the upper surface of the block 60a and the lower surface of the base part 31a of the heat sink 30a are connected, they are bonded and fixed by the double-faced tape 72.

The thermal conduction sheet 71 makes the objects to be cooled and the block 60a stick together and plays a roll of a buffer material in the attachment and detachment of the heat sink 30a to and from the circuit board 100a. The thermal conduction sheet 71 is made of a heat conductive material to promote the movement of the heat similar to the block 60a. The shape of the thermal conduction sheet 71 is matched with the shape of the upper surface of the object to be cooled and the lower surface of the block 60a.

The double-faced tape 72 connects the block 60a and the base part 31a of the heat sink 30a. Similar to the block 60a, the double-faced tape 72 is made of a low heat resistance material so as not to prevent the movement of heat. The shape of the double-faced tape 72 is matched with the shape of the upper flat surface of the block 60a.

<Mounting of the Board into the Logic Box (1)>

Figure 8:
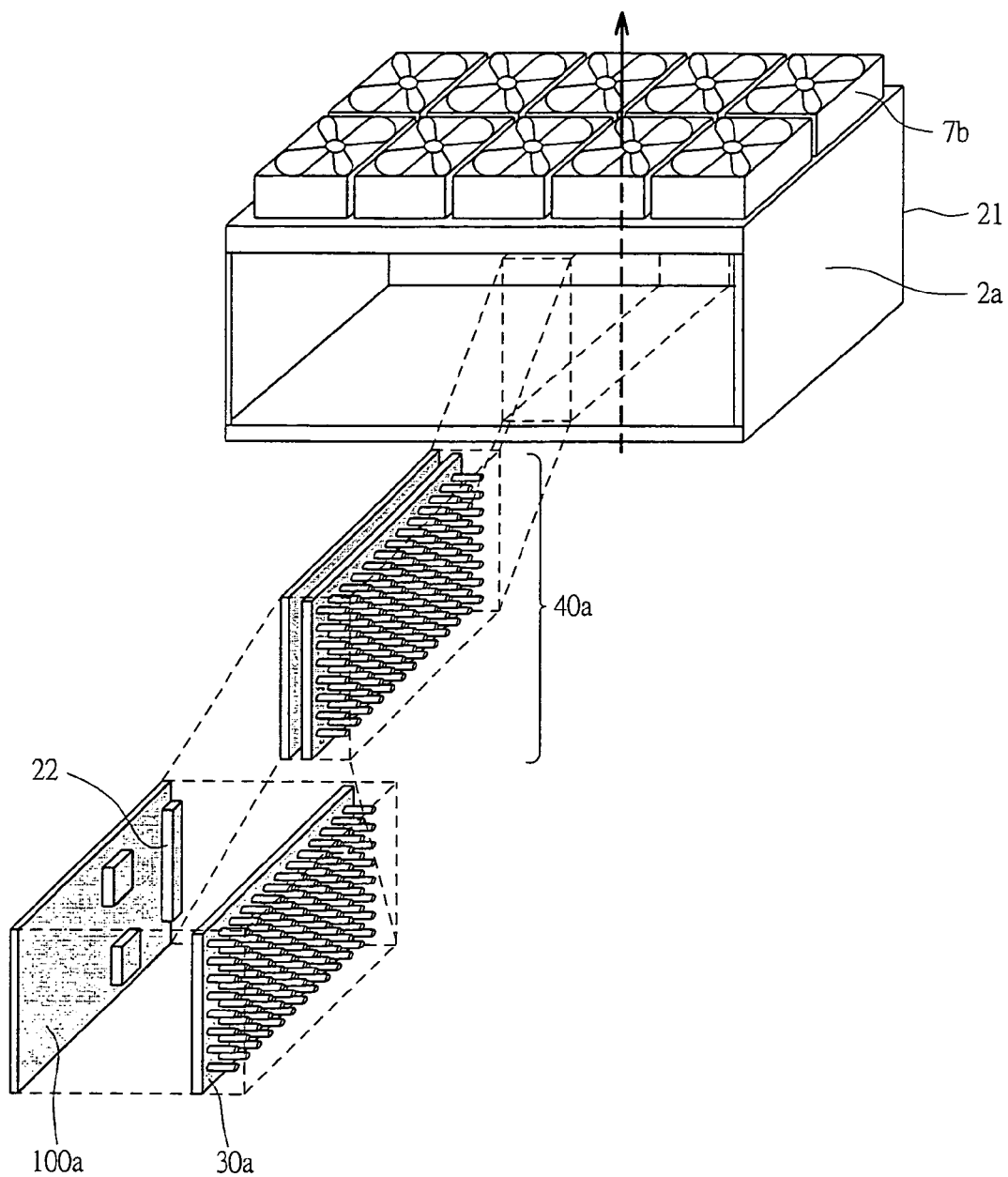
FIG. 8 is a diagram showing the installation of the board in a logic box in the first housing structure in the disk array system according to the first embodiment of the present invention.

A mounting of the board 40a fitted with the heat sink into the logic box 2 in the first embodiment will be described. FIG. 8 is a perspective view showing the mounting of the circuit board 100 into the logic box 2a corresponding to the first housing structure. The arrow in the drawing represents the airflow. One example of the mounting of the circuit board 100a into the logic box 2a is shown in FIG. 8.

The logic box 2a has openings for the ventilation of the air in the lower and upper surfaces thereof and the air flows in through the lower surface, and the air inside the logic box 2a is discharged by the operation of the fans 7b installed on the upper surface.

The back plane 21 (not shown) of the logic box 2a is provided with various input-output terminals and wirings. The circuit board 100a is connected to the corresponding portion of the back plane 21 by the back plane connector 22 provided on one side of the circuit board 100a. The circuit board 100a and other circuit boards are connected through the wirings in the back plane 21 so that the data transfer process can be performed therebetween.

The circuit board 100a is stored in the logic box 2a in the form of the board 40 fitted with the heat sink obtained by fitting the heat sink 30a to the circuit board 100a. The board 40 fitted with the heat sink is inserted from the front of the logic box 2a by the worker and is set to the predetermined position, and then, the board 40 is set in a connected state.

The procedure of mounting and dismounting the circuit board 100 on and from the logic box 2a will be described. The worker who mounts the circuit boards 100a into the logic box 2a first selects the circuit board 100a having the objects to be cooled and required to fit the heat sink 30a from among a plurality of circuit boards 100 to be installed in the logic box 2. The worker assembles the board 40a fitted with the heat sink by using the circuit board 100a having the objects to be cooled, the heat sink 30a, the block 60a, and other parts. The worker selects the layout of the block 60a depending on the layout and the shape of the objects to be cooled on the circuit board 100a and adjusts the heights for connecting the heat sink. The worker adheres and fixes the block 60a to the lower surface of the base part 31a of the heat sink 30a by the double-faced tape 72 based on the layout of the block 60a. Then, the worker interposes and sticks the thermal conduction sheet 71 between the block 60a and the objects to be cooled. Thereafter, the worker fits the screws 75 into the screw holes 74 at the four corners of the heat sink 30a and the heat sink fixture 73 of the circuit board 100a to fix the whole.

The worker inserts and sets the assembled board 40a fitted with the heat sink into the predetermined position in the logic box 2a and thus the board 40a is connected to the back plane 21. The dismounting of the circuit board 100a from the logic box 2a can be made by performing this procedure in reverse.

Further, if there is the circuit board 100 which does not have the objects to be cooled, it is possible to directly store it into the logic box 2a without mounting the heat sink 30a.

Figure 9:
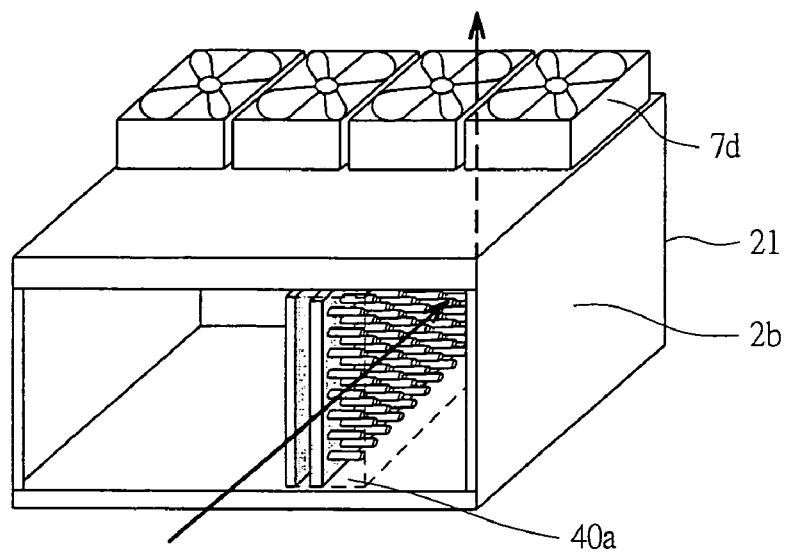
FIG. 9 is a diagram showing the installation of the board in a logic box in the second housing structure in the disk array system according to the first embodiment of the present invention.

Also, FIG. 9 is a perspective view showing the mounting of the circuit board 100 into the logic box 2b corresponding to the second housing structure. The arrows in the drawing represent the airflow. One example of the mounting of the circuit board 100a into the logic box 2b is shown in FIG. 9.

The logic box 2b has openings for the ventilation of the air in the front surface and in the mounting portion of the fans 7d in the backside on the upper surface, and the air flows in through the lower surface and the air inside the logic box 2b is discharged by the operation of the fans 7d installed in the backside on the upper surface. Similar to the first housing structure, the circuit board 100a in the form of the board 40 fitted with the heat sink is connected and stored in the logic box 2b. FIG. 9 shows the state after the board 40a fitted with the heat sink is stored in the logic box 2b.

In the first embodiment, under the above-described structure, the whole circuit board 100a is covered and connected by a large-size heat sink 30a having the flat surface with almost the same size as the board 100a, and a plurality of objects to be cooled, that is, the LSI 51a and the wiring area 52a are collectively cooled. The heat generated by the power supply to the LSI 51a and the operation of the LSI 51a is sequentially transmitted from the LSI 51a and the wiring area 52 to the heat sink 30a through the thermal conduction sheet 71, the block 60a and the double-faced tape 72, and further, the heat is transmitted from the base part 31a of the heat sink 30a to the radiator fins 32a and released. In this manner, a plurality of objects to be cooled are cooled.

The advantages of the structure in the above-described first embodiment are as follows. That is, since a plurality of objects to be cooled on the circuit board 100a are cooled by the single heat sink 30a, the difference in heat quantity generated from electronic components such as the LSI 51a as the object to be cooled can be absorbed by the heat sink 30a and a temperature difference among respective electronic components are averaged and reduced. In addition, with regard to the wiring area 52a to be the transmission path of the high-speed data transfer on the circuit board 100a, the temperature difference thereof can be reduced by the heat sink 30a.

Further, since a plurality of objects to be cooled on the circuit board 100a are cooled by the heat sink 30a and the temperature difference can be reduced, the reflection noises generated by the impedance mismatch in the transmission paths particularly in the high-speed data transfer process, that is, in the LSI 51a as a main part of the process and the wiring area 52a can be reduced and the degradation of the signal can be prevented. Therefore, the high-speed data transfer process can be stably performed.

Further, since the cooling and radiation are performed by a single large-size heat sink 30a, a radiation efficiency is improved in comparison with the structure in which a small-size heat sink is attached to each object to be cooled.

Also, since the heat sink 30a is made larger in a direction horizontal to the circuit board in comparison with the conventional small-size heat sink so as to enhance the radiation efficiency, the height of the heat sink 30a itself can be reduced, which contributes to the size reduction of the logic box 2 and the disk array system 1.

Further, since the block 60a used in the connection of the heat sink 30a can be easily detached, even when the heat sink 30a is to be attached to the circuit board 100a having the different mounting position and height of the LSI 51a as the object to be cooled, the connection can be achieved by simply replacing the block 60a. Therefore, it is unnecessary to prepare an exclusive heat sink matched with the shape of each circuit board 100a. Consequently, it is possible to flexibly cope with the case where the mounting position of the electronic components on the circuit board 100a is changed, and thus, it becomes possible to provide the high versatility.

Further, even when a large number of objects to be cooled are mounted on the circuit board 10a, it is possible to easily attach and detach the heat sink 30a. For example, in the case where the heat sink is attached for each of a plurality of LSIs like in the conventional ways, when replacing the parts mounted on the circuit board, it is necessary to follow the procedure in which all the heat sinks for each LSI are detached to replace the LSIs, and then, the heat sinks are attached again on all the LSIs. In the structure of the first embodiment, the number of the attaching and detaching operations of the heat sink 30a required when replacing the part mounted on the circuit board 10a is only once. Therefore, this is effective in the case where cooling means such as the heat sink is required for a number of parts. Also, the seal printed on the LSI can be easily confirmed.

As a modification example of the first embodiment, it is possible to form the structure in which the size of the flat surface of the base part 31a of the heat sink 30a is made slightly smaller than the flat surface of the circuit board 100a. In this case, the whole of a plurality of objects to be cooled are allowed to be located in the area covered by the lower surface of the base part 31a of the heat sink 30a. In addition, it is also possible to form the structure in which the size and shape of the flat surface of the base part 31a of the heat sink 30a have the size and shape capable of covering the whole of the objects to be cooled including a plurality of electronic components or the wiring area on the circuit board 100a. That is, the size and shape of the flat surface of the base part 31a of the heat sink 30a are matched with the size and shape of the minimum cooled area 53. In any cases, the advantage of reducing the temperature difference in a plurality of objects to be cooled can be achieved.

Further, the above-described method for connecting and fixing the heat sink 30a to the circuit board 100a is just one example, and for example, it is also possible to form the structure in which the base part 31a is connected and fixed to the circuit board 100a with the screws 75 in an exposed state without providing the heat sink fixture 73. The positions of the heat sink fixture 73 in the circuit board 100a and the screw holes 74 in the heat sink 30a can be provided on the parts other than the outer periphery if it does not hinder the mounted parts and wirings on the circuit board 100a. Also, if the objects to be cooled on the circuit board 100a and the heat sink 30a can be more stably connected and fixed via the block 60a, other connection and fixation means other than the screws 75 can be used.

Second Embodiment

Figure 10:
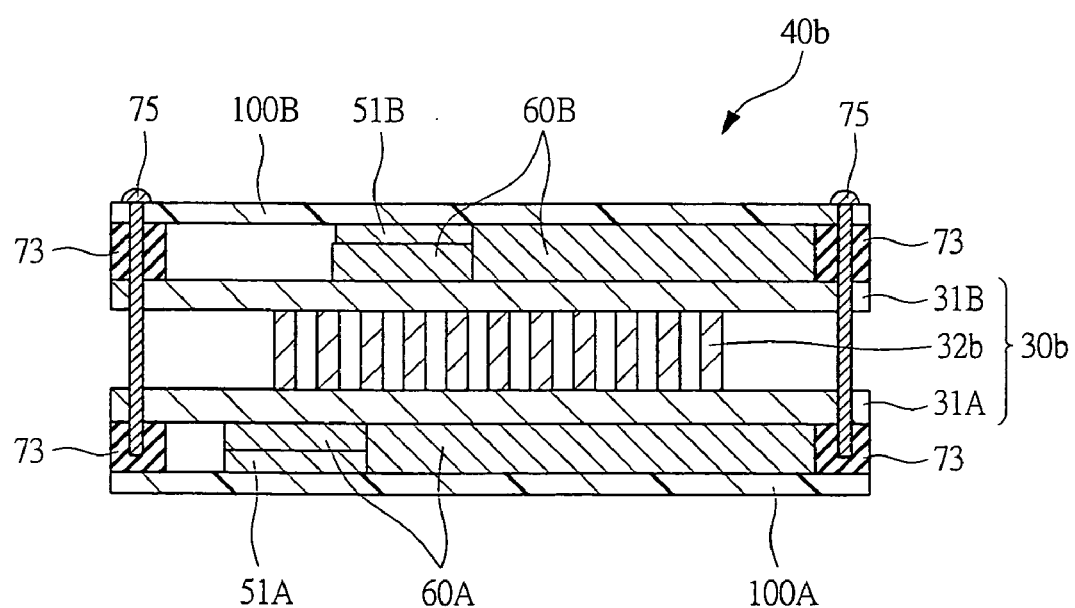
FIG. 10 is a sectional view showing the board fitted with the heat sink in the disk array system according to the second embodiment of the present invention.
Figure 11:
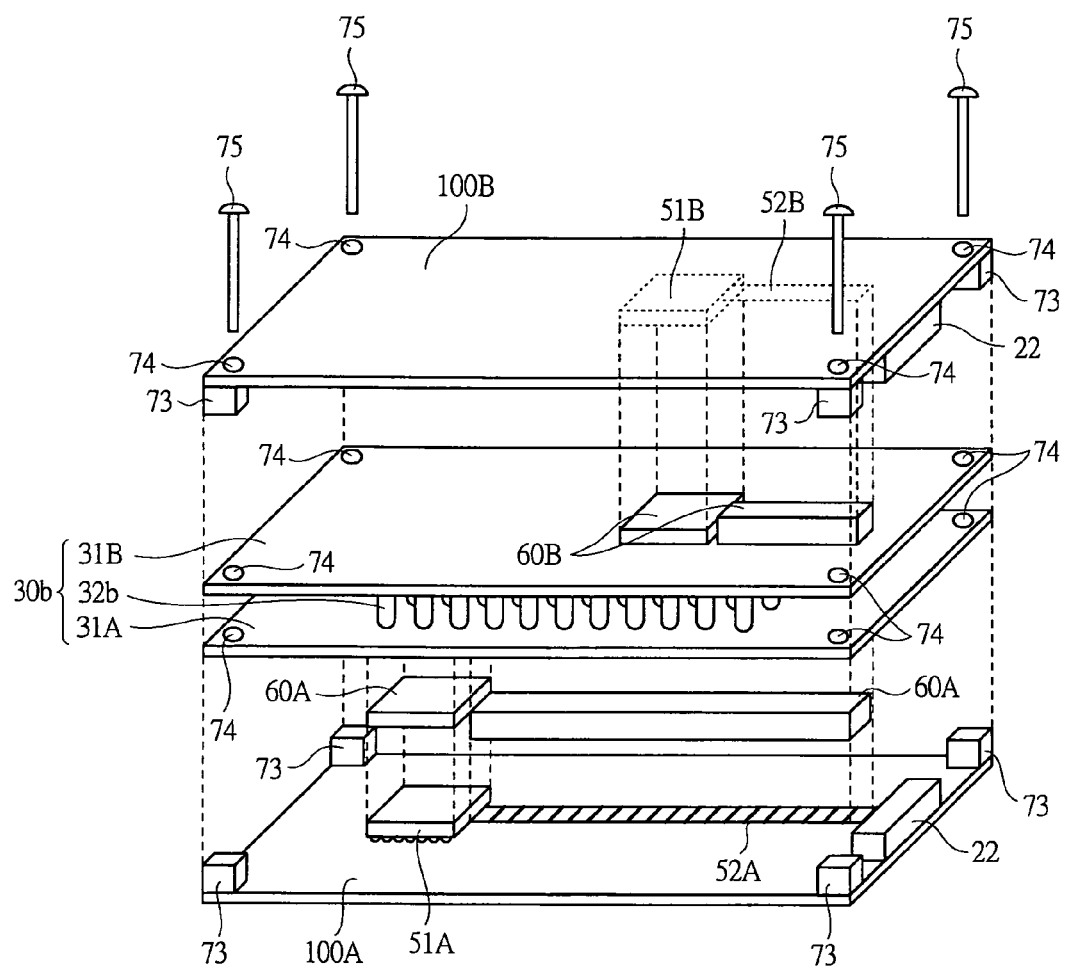
FIG. 11 is a perspective view showing a disassembled state of the board fitted with the heat sink in the disk array system according to the second embodiment of the present invention.

A disk array system according to a second embodiment of the present invention will be described below. FIG. 10 is a sectional view of a board 40b fitted with a heat sink in the disk array system according to the second embodiment. FIG. 11 is a perspective view showing a disassembled state of the board 40b fitted with the heat sink in the disk array system according to the second embodiment. The basic structure of the disk array system according to the second embodiment corresponds to the structure of the above-described disk array system 1.

In the structure according to the first embodiment, the heat sink 30a is required for each one circuit board 100a having the on the circuit board 100a. Therefore, a number of spaces equivalent to the number of heat sinks 30a are required when a plurality of circuit boards 100 are connected and stored in the logic box 2. Also, though the temperature difference between the on the circuit board 100a on one circuit board 100a can be reduced, the temperature difference between the parts in one circuit board 100a and the parts in another circuit board cannot be reduced.

In the second embodiment, the board 40b fitted with the heat sink is composed such that one heat sink 30a is interposed between two circuit boards 100 which makes a pair, and in this state, the two circuit boards 100 are connected via heat conductive blocks 60A and 60B and then the whole is fixed. In this way, a plurality of objects to be cooled distributed on the two circuit boards 100 are cooled by one heat sink 30b.

In the second embodiment, a heat sink 30b which has a shape different from the heat sink 30a in the first embodiment is used. The heat sink 30b is composed of plate-shaped flat surface portions to be base parts 31A and 31B provided on both sides of radiator fins 32b. These two flat surface portions are in parallel to each other. The circuit board 100 can be connected to the flat surfaces of these base parts 31A and 31B.

Following a pair selection described later, a first circuit board 101A and a second circuit board 100B, which make a pair, are selected. For example, two circuit boards (a pair of CHA board 11 and switch board 12, and the like) which perform the data transfer process between electronic components such as the LSIs on the circuit boards 100 are selected as a pair.

The board 40b fitted with the heat sink is mainly composed of a first circuit board 10A, a second circuit board 100B, a heat sink 30b, and blocks 60A and 60B. Also, the board 40b fitted with the heat sink has a thermal conduction sheet 71, a double-faced tape (low heat resistance double-faced tape) 72, a heat sink fixture (screw support) 73, screw holes 74, screws 75 and the like as the parts or members to connect and fix them.

One or more LSIs 51A and one or more wiring areas 52A are provided on the circuit board 100A as the objects to be cooled. Similarly, one or more LSIs 51B and one or more wiring areas 52B are provided on the circuit board 100B as the objects to be cooled. The LSI 51A is an electronic component for performing the high-speed transfer process, and the wiring area 52A composed of the wirings to be the transmission path of a high-speed signal is connected to the LSI 51A. Similarly, the LSI 51B is an electronic component for performing the high-speed transfer process, and the wiring area 52B composed of the wirings to be the transmission path of a high-speed signal is connected to the LSI 51B.

The wiring area 52A on the circuit board 10A is connected to the back plane connector 22. Further, the wiring area 52A on the circuit board 100A and the wiring area 52B on the circuit board 100B are connected through the wiring of the back plane 21.

Note that FIGS. 10 and 11 show an example in which only one LSI 51A (51B) and only one wiring area 52A (52B) as the objects to be cooled are mounted on the circuit board 10A (100B), and the illustration of other electronic components, wirings and the like which are not the objects to be cooled is omitted.

The heat sink fixtures 73 are provided in the outer periphery of the circuit boards 100A and 100B. The heat sink fixture 73 may be formed as a part of the circuit boards 100A and 100B or connected to the circuit boards 100A and 100B as a separate part afterwards. In this case, particularly, the heat sink fixtures 73 are provided at four corners of the outer periphery of the circuit boards 100A and 100B.

The heat sink 30b is a part for collectively cooling the LSIs 51A and 51B and the wiring areas 52A and 52B which are the objects to be cooled on the circuit boards 100A and 100B. The heat sink 30b has a base part 31A, a base part 31B, and radiator fins 32b and is made of materials with high thermal conductivity (low heat resistance) such as aluminum and copper. The base parts 31A and 31B are portions with almost flat plate shape. The base parts 31A and 31B are provided with screw holes 74 particularly at the four corners of the outer periphery thereof. The radiator fins 32b are composed of a plurality of almost cylindrical fins arranged vertically between the base parts 31A and 31B in a matrix manner. The shape of the radiator fin 32b shown here is merely an example, and various shapes and types of the radiator fin 32b are also available. The radiation is enhanced by the air-cooling by the air flown through the area of the radiator fin 32b.

One circuit board 100A is connected to one surface of the heat sink 30b, that is, the outer flat surface of the base part 31A via the block 60A, and the other circuit board 100B is connected to the other surface of the heat sink 30b, that is, the outer flat surface of the base part 31B via the block 60B.

When the board 40b fitted with the heat sink is assembled, the whole parts including the two circuit boards 100A and 100B, the heat sink 30b, and the blocks 60A and 60B are connected and fixed by screws. Each of the circuit boards 100A and 100B and the heat sink 30b is fixed by one long screw as the screw 75. Further, as other connection and fixation means, it is also possible to separately fix the circuit board 101A and the base part 31A of the heat sink 30b and the circuit board 100B and the base part 31B by two long screws as the screws 75.

The positions of the heat sink fixtures 73 in the circuit boards 101A and 100B and the screw holes 74 in the heat sink 30b are located in the outer peripheral portion, particularly at four corners thereof so as not to hinder the mounting of the parts and the wirings in the circuit boards 100A and 100B.

When fixing the circuit board 101A and the heat sink 30b, the outer flat surface of the base part 31A of the heat sink 30b and the upper flat surface (the surface having the objects to be cooled) of the circuit board 101A are opposed to each other, and the block 60A located on the objects to be cooled on the circuit board 100A is interposed between the circuit board 100A and the heat sink 30b. In this state, the circuit board 101A and the heat sink 30b are fixed by the heat sink fixture 73, the screw holes 74 and the screws 75 and the like. Similarly, when fixing the circuit board 100B and the heat sink 30b, the outer flat surface of the base part 31B of the heat sink 30b and the upper flat surface of the circuit board 100B are opposed to each other, and the block 60B located on the objects to be cooled on the circuit board 100B is interposed between the circuit board 100B and the heat sink 30b. In this state, the circuit board 100B and the heat sink 30b are fixed by the heat sink fixture 73, the screw holes 74 and the screws 75 and the like.

The height of the objects to be cooled on the circuit boards 101A and 100B is not uniform. Therefore, similar to the first embodiment, the blocks 60A and 60B are interposed and connected between the objects to be cooled and the base parts 31A and 31B of the heat sink 30b. In this way, the space is filled with the solid blocks 60A and 60B and the difference in height of the objects to be cooled is compensated, and in this manner, the heat is moved from the objects to be cooled to the heat sink 30b.

The blocks 60A and 60B are made of materials with high thermal conductivity such as aluminum and copper. The height of the blocks 60A and 60B is designed to match with the length between the upper flat surface of the object to be cooled to be the connection flat surface and the outer flat surface of the base parts 31A and 31B of the heat sink 30b. The shape of the blocks 60A and 60B in the direction of the board flat surface is almost the same as the upper flat surface of the object to be cooled. Similar to the first embodiment, a number of blocks 60A and 60B equivalent to the number of objects to be cooled are used in the connection.

Further, for example, the shape of the blocks 60A and 60B in the direction of the board flat surface may be an optional shape having a larger size than that capable of covering the whole objects to be cooled. In addition, it is also possible to use a smaller number of blocks 60A and 60B than the number of objects to be cooled or a single block 60A and 60B to adjust the height of the heat sink connection even when there are a plurality of objects to be cooled.

The layout of the blocks 60A and 60B is determined depending on the layout and the shape of the objects to be cooled on the circuit boards 100A and 100B, and the objects to be cooled and the heat sink 30b are thermally connected through the heat conductive blocks 60A and 60B.

Further, it is also preferable that various types and a number of unit blocks having the predetermined shape are prepared in advance as the blocks 60A and 60B, and the connection between the objects to be cooled and the heat sink 30b is made by combining these unit blocks.

Although not shown in FIGS. 10 and 11, similar to the first embodiment, also in the second embodiment, the thermal conduction sheet 71 and the double-faced tape 72 are used for filling and connection of the blocks 60A and 60B. When connecting the lower surface of the block 60A and the upper flat surfaces of the objects to be cooled 51A and 52A on the circuit board 100A, the thermal conduction sheet 71 is interposed therebetween. Also, when connecting the upper surface of the block 60A and the outer flat surface of the base part 31A of the heat sink 30b, the upper surface of the block 60A and the outer flat surface of the base part 31A of the heat sink 30b are adhered and fixed by the double-faced tape 72. Similarly, on the side of the circuit board 100B, the filling and connection of the block 60B are performed by using the thermal conduction sheet 71 and the double-faced tape 72.

<Mounting of the Board into the Logic Box (2)>

Figure 12:
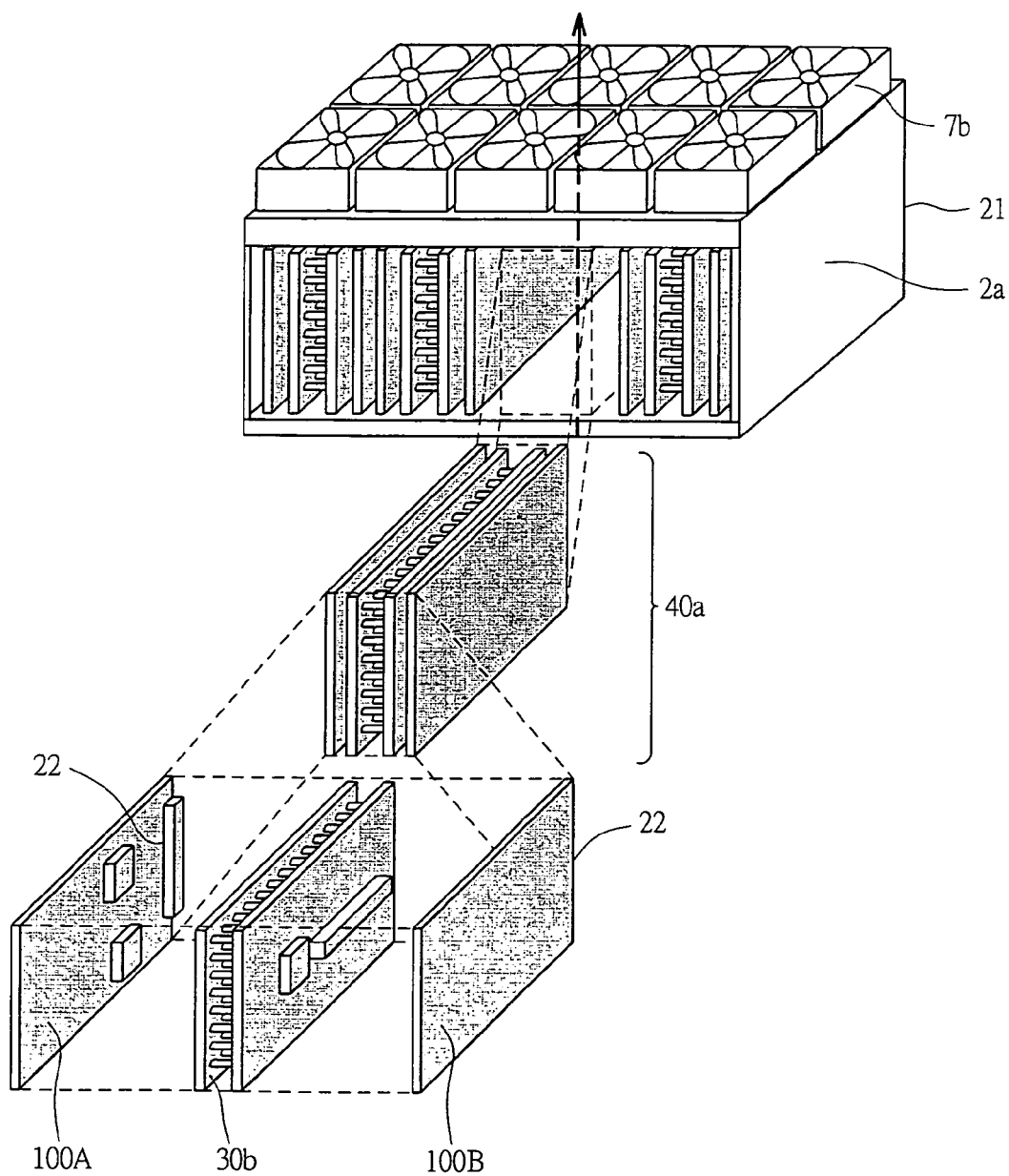
FIG. 12 is a diagram showing the installation of the board in a logic box in the first housing structure in the disk array system according to the second embodiment of the present invention.

A mounting of the board 40b fitted with the heat sink into the logic box 2 in the second embodiment will be described. FIG. 12 is a perspective view showing the mounting of the circuit board 100 into the logic box 2a corresponding to the first housing structure. The arrow in the drawing represents the airflow. One example of the mounting of the circuit board 100a into the logic box 2a is shown in FIG. 12.

The circuit boards 100A and 100B are connected to the corresponding portions of the back plane 21 by the back plane connectors 22 provided on one side of the circuit boards 100A and 100B. The circuit boards 100A and 100B are connected through the wirings in the back plane 21 so that the data transfer process can be performed therebetween.

The pair of the circuit boards 100A and 100B is stored in the logic box 2a in the form of the board 40b fitted with the heat sink obtained by fitting the heat sink 30b to the circuit boards 100A and 100B. The board 40b fitted with the heat sink is inserted from the front of the logic box 2a by the worker and is set to the predetermined position, and then, the board 40b is set in a connected state.

The procedure of mounting and dismounting the circuit board 100 on and from the logic box 2a will be described. The worker who mounts the circuit boards 100 into the logic box 2a first selects the circuit board 100 having the objects to be cooled and required to fit the heat sink 30b from among a plurality of circuit boards 100 to be installed in the logic box 2. Two circuit boards 100A and 100B are selected as a pair based on a pair selection described later.

Next, the worker assembles the board 40b fitted with the heat sink by using the circuit boards 101A and 100B having the objects to be cooled, the heat sink 30b, the blocks 60A and 60B, and other parts. The worker first connects the flat surface of one base part 31A of the heat sink 30b to the opposed surface of one circuit board 100A having the objects to be cooled with interposing the block 60A and other parts therebetween. Then, the worker adheres and fixes the block 60A on the outer flat surface of the base part 31A of the heat sink 30b by the double-faced tape 72 according to the layout of the objects to be cooled on the circuit board 100A, and the thermal conduction sheet 71 is interposed between the block 60A and the objects to be cooled, thereby sticking the circuit board 100A and the heat sink 30b. Next, the worker connects the flat surface of the other base part 31B of the heat sink 30b to the opposed surface of the other circuit board 100B having the objects to be cooled with interposing the block 60B and other parts therebetween. Similarly, each part including the block 60B is connected and arranged between the circuit board 100B and the base part 31B of the heat sink 30b, and then, the heat sink 30b is connected to the circuit board 100B. Thereafter, the worker fits the screws 75 into the screw holes 74 at the four corners of the heat sink 30b and the heat sink fixtures 73 of the circuit boards 100A and 100B and fixes the whole of the circuit board 100A, the heat sink 30b and the circuit board 100B.

The worker inserts and sets the assembled board 40b fitted with the heat sink into the predetermined position in the logic box 2a and thus the circuit boards 100A and 100B are connected to the back plane 21. The dismounting of the circuit boards 100A and 100B from the logic box 2a can be made by performing this procedure in reverse.

Figure 13:
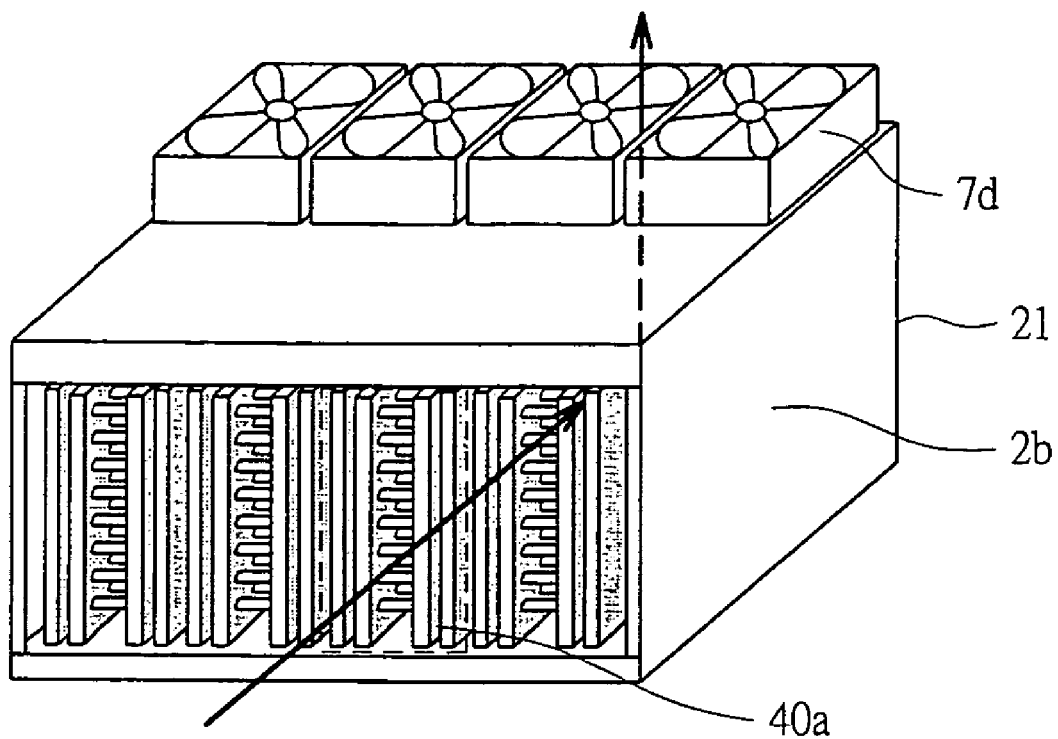
FIG. 13 is a diagram showing the installation of the board in a logic box in the second housing structure in the disk array system according to the second embodiment of the present invention.

Also, FIG. 13 is a perspective view showing the mounting of the circuit board 100 into the logic box 2b corresponding to the second housing structure. The arrows in the drawing represent the airflow. One example of the mounting of the circuit board 100 into the logic box 2b is shown in FIG. 13. Similar to the case of the first housing structure, the circuit boards 100A and 100B in the form of the board 40b fitted with the heat sink are connected and stored in the logic box 2b. FIG. 13 shows a state after the board 40b fitted with the heat sink is stored in the logic box 2b.

<Pair Selection of Circuit Board>

As shown in FIG. 12, when the circuit board 100 in the form of the board 40b fitted with the heat sink is stored in the logic box 2, two circuit boards are selected as a pair from among a plurality of circuit boards 100 corresponding to each function such as CHA, the switch, the cache memory, DKA and the like. When two circuit boards 100A and 100B are paired when mounting the heat sink 30b, it is effective to combine those performing the data transfer between the circuit boards 100A and 100B from the viewpoint of the cooling efficiency. Therefore, the pair is decided by taking into consideration the amount of data transferred between the circuit boards 100 in the disk array system 1.

According to the structure shown in FIG. 3, there are three combinations of the circuit boards 100 which perform the data transfer process such as the CHA board 11 and the switch board 12 (first pair), the switch board 12 and the cache board 13 (second pair), and the switch board 12 and the DKA 14 (third pair).

Also, FIG. 14 shows a heat generation (assessed value) by means of consumption power and temperature in the LSI on each circuit board 100 in a state where cooling means such as the heat sink is not used in the disk array system according to an embodiment of the present invention. When an ambient temperature is 25 [° C.] and a heat resistance is 7.3[° C./W], the consumption power is 9.4 [W] and the temperature is 93.6 [° C.] in the CHA LSIs 110a and 110b. In the DKA LSIs 140a and 140b, the consumption power is 9.2 [W] and the temperature is 92.2 [° C.]. In the cache LSIs 130a and 130b, the consumption power is 13.7 [W] and the temperature is 125.0 [° C.]. In the switch LSIs 120a and 120b, the consumption power is 14.0 [W] and the temperature is 127.2 [° C.]. As described above, the heat generation becomes large particularly in the switch board 12 and the cache board 13.

Considering the data flow between the circuit boards at the time of the data read/write, a combination of the circuit boards having a large amount of data transfer process or a large amount of data transfer is as follows. That is, 1: the second pair, 2: the first pair, and 3: the third pair. Since both read/write operations use the cache memory, it is efficient to combine the switch board 12 and the cache board 13 as a pair. The pair of the CHA board 11 and the switch board 12 follows the pair of the switch board 12 and the cache board 13.

Also, when all of the switch boards 12 are selected as a pair, the remaining circuit boards 100 are the CHA board 11, the DKA board 14 and the cache board 13. Usually, since the data transfer is not performed directly among these boards and the data transfer is performed via the switch board 12, it is not so necessary to make a pair from these circuit boards 100.

Further, when a pair is made from the same type of the circuit boards 100, the data transfer is not performed between the circuit boards 100. However, since the temperature difference can be reduced between the circuit boards 100, the difference due to the circuit boards 100 can be absorbed and averaged. In the case of the redundant configuration in the disk array system 1, since there are a plurality of combinations of the circuit boards 100 through which an access is made from the same host 200 to the disk device 150, the pair from the same type of the circuit boards 100 is effective in this case.

Considering the above-descried aspects, the selection of the pair of the circuit boards 100 is effective in the order as follows. That is, 1: the second pair, 2: the first pair, 3: the third pair, and 4: the pair of the same type boards of the CHA board 11, the DKA board 14, and the cache board 13. Based on these four types of the pair, the circuit boards 100 are combined to form a plurality of boards 40b fitted with the heat sink.

In the second embodiment, under the above-described structure, the whole circuit boards 100A and 100B are connected by a heat sink 30b having the flat surface with almost the same size as the boards 100A and 100B, and a plurality of objects to be cooled, that is, the LSIs 51A and 51B and the wiring areas 52A and 52B are collectively cooled. The heat generated by the power supply to the LSI 51A and the operation of the LSI 51A on the circuit board 100A is sequentially transmitted from the LSI 51A and the wiring area 52A to the heat sink 30b through the thermal conduction sheet 71, the block 60A and the double-faced tape 72, and further, the heat is transmitted from the base part 31A of the heat sink 30b to the radiator fins 32b and released. Similarly, in the case of the circuit board 100B, heat is sequentially transmitted from the LSI 51B and the wiring area 52B to the heat sink 30b through the thermal conduction sheet 71, the block 60B, and the double-faced tape 72, and further, the heat is transmitted from the base part 31B of the heat sink 30b to the radiator fins 32b and released. In this manner, a plurality of objects to be cooled are cooled.

The advantages of the structure in the above-described second embodiment are as follows. That is, since a plurality of objects to be cooled on the paired circuit boards 100A and 100B are cooled by the single heat sink 30b, the difference in heat quantity generated from electronic components such as the LSIs 51A and 51B as the objects to be cooled can be absorbed by the heat sink 30b and a temperature difference among respective electronic components are averaged and reduced. In addition, with regard to the wiring areas 52A and 52B to be the transmission paths of the high-speed data transfer on the circuit boards 101A and 100B, the temperature difference therebetween can be reduced by the heat sink 30b.

Further, since the temperature difference between a plurality of objects to be cooled can be reduced, the reflection noises generated by the impedance mismatch in the transmission paths particularly in the high-speed data transfer process, that is, in the LSIs 51A and 51B as main parts of the process and the wiring areas 52A and 52B can be reduced and the degradation of the signal can be prevented. Therefore, the high-speed data transfer process can be stably performed between the circuit boards 100A and 100B. For example, the stable high-speed data transfer process can be performed between a switch LS1 120a on one circuit board 100 and a cache LSI 130a on the other circuit board 100.

Further, since one heat sink 30b is used for two circuit boards 100A and 100B having the objects to be cooled, the overall number of heat sinks to be used can be reduced. Further, since the radiator fin is used commonly by the two circuit boards 100A and 100B, the space required for the radiator fin can be reduced. Therefore, the space can be saved when a plurality of circuit boards 100 are connected and stored in the logic box 2. As a result, it is possible to contribute to the size reduction of the logic box 2 and the disk array system 1.

Third Embodiment

Figure 15:
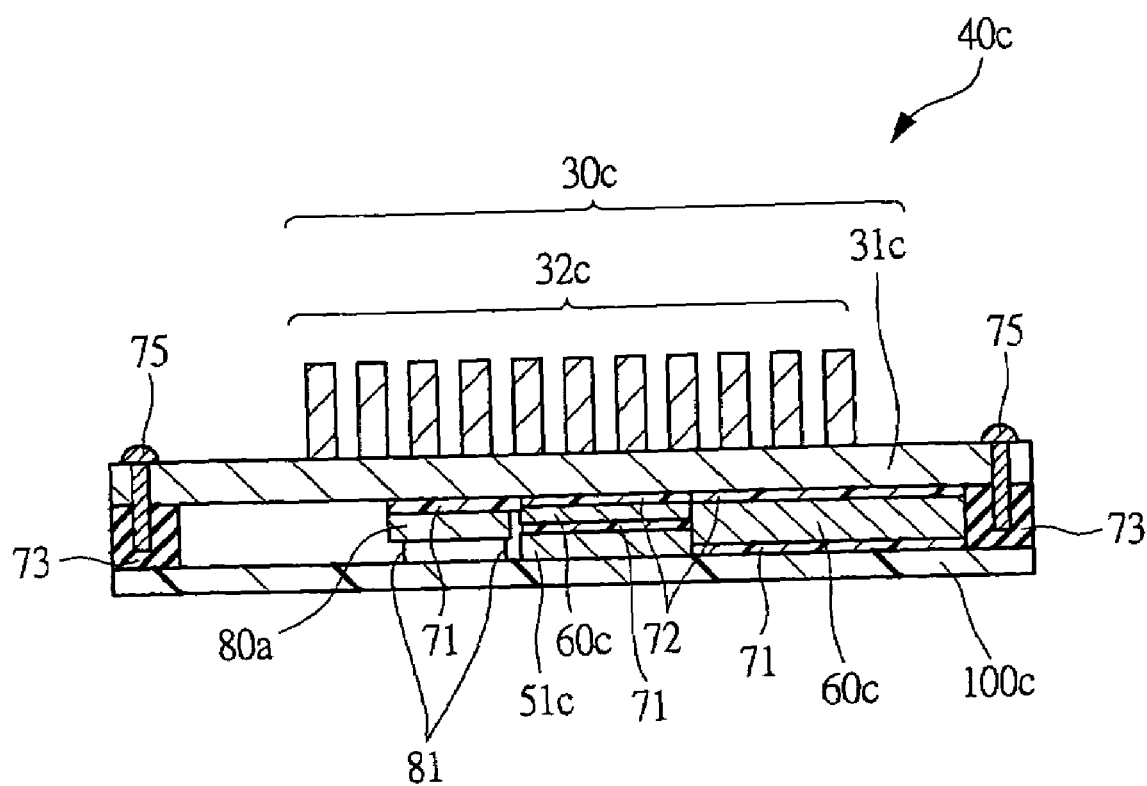
FIG. 15 is a sectional view of the board fitted with the heat sink in the disk array system according to the third embodiment of the present invention.
Figure 16:
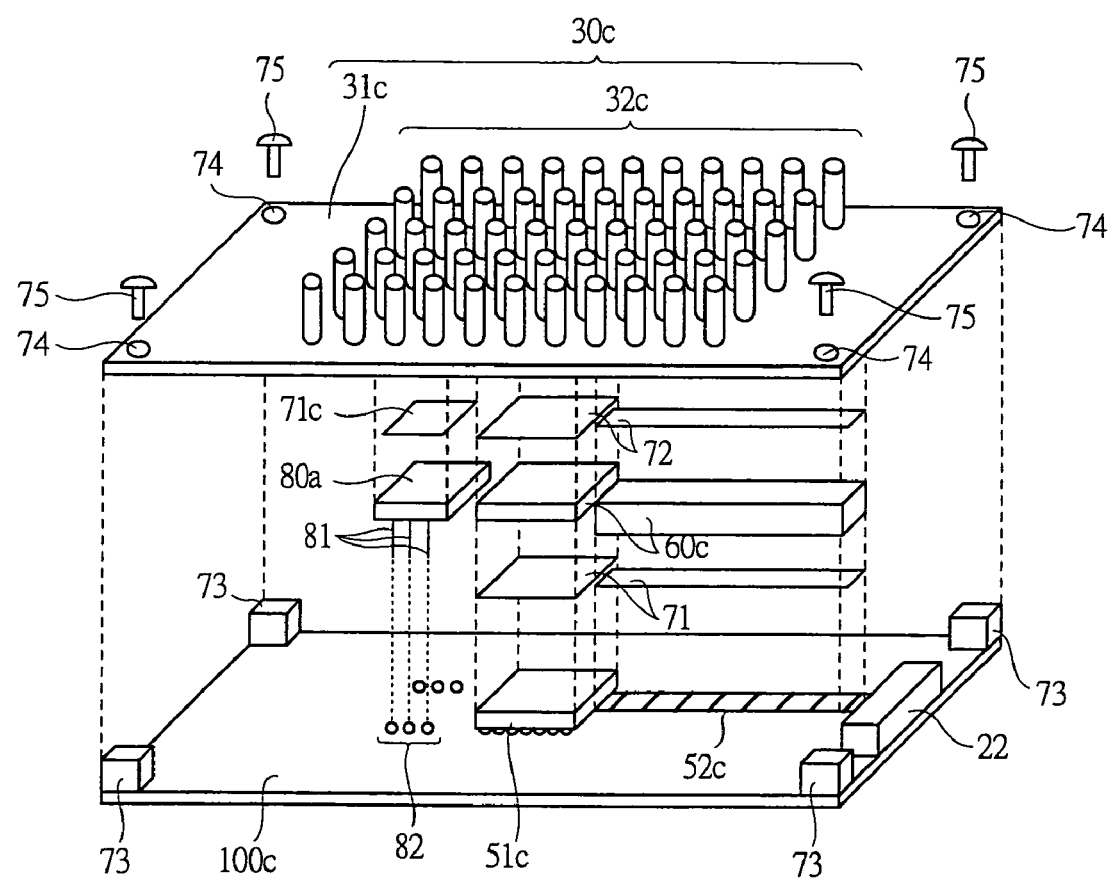
FIG. 16 is a perspective view showing the disassembled state of the board fitted with the heat sink in the disk array system according to the third embodiment of the present invention.

Next, a disk array system according to a third embodiment of the present invention will be described below. FIG. 15 is a sectional view of a board 40c fitted with a heat sink in the disk array system according to the third embodiment. FIG. 16 is a perspective view showing a disassembled state of the board 40c fitted with the heat sink in the disk array system according to the third embodiment. The basic structure of the disk array system according to the third embodiment corresponds to the structure of the above-described disk array system 1.

In the third embodiment, based on the structure of the first embodiment, a DC—DC converter 80a which is a unit for stably supplying the power to electronic components such as LSI on circuit board 100 is additionally installed on the board 40 fitted with the heat sink. In the third embodiment, the DC—DC converter 80a for supplying power to the LSI 51c on the circuit board 100c is connected to the lower flat surface (connection surface) of a base part 31c of a heat sink 30c. The DC—DC converter 80a is arranged at a position separated from a wiring mounted surface on the circuit board 100c. The connection position is a position in the vicinity of the LSI 51c to which the power is supplied, that is, a position capable reducing a length of the power supply path.

The board 40c fitted with the heat sink is mainly composed of the circuit board 100c, a heat sink 30c, block 60c and a DC—DC converter 80a. Also, the board 40c fitted with the heat sink has a thermal conduction sheet 71, a double-faced tape (low heat resistance double-faced tape) 72, a heat sink fixture (screw support) 73, screw holes 74, screws 75 and the like as the parts or members to connect and fix them. In addition, screws (not shown) for connecting and fixing the DC—DC converter 80a are also provided.

One or more LSIs 51c and one or more wiring areas 52c as the objects to be cooled are provided on the circuit board 100c. The LSI 51c is an electronic component for performing the high-speed transfer process, and the wiring area 52c composed of the wirings to be the transmission paths of a high-speed signal is connected to the LSI 51c. The wiring area 52c on the circuit board 100c is connected to the back plane connector 22, and further, the wiring area 52c is connected to other circuit boards 100 through the wiring of the back plane 21. The heat sink fixtures 73 are provided in the outer periphery of the circuit board 100c. Note that FIGS. 15 and 16 show an example in which only one LSI 51c and only one wiring area 52c as the objects to be cooled are mounted on the circuit board 100c, and the illustration of other electronic components, wirings and the like which are not the objects to be cooled is omitted. Also, an example in which only one LSI 51c as a power supply target is provided is shown.

In addition, the circuit board 100c has power supply planes according to power supply types and has a wiring for supplying power to the LSI 51c via the DC—DC converter 80a in this power supply plane. More specifically, the circuit board 100c has the wiring for supplying power from the back plane 21 to the DC—DC converter 80 and the wiring for supplying power from the DC—DC converter 80a to the LSI 51c in the power supply plane. Further, the wiring from the back plane 21 is connected to the wiring in the power supply plane of the circuit board 100c via the back plane connector 22.

The heat sink 30c has the base part 31c, the radiator fins 32c, and a DC-Dc converter connection means (not shown). The heat sink 30c has almost the same structure as the heat sink 30a. However, it is different in that the base part 31c can be connected to the DC—DC converter 80a through the DC—DC converter connection means. The heat sink 30c is a part for collectively cooling the LSI 51c and the wiring area 52c as the objects to be cooled, and at the same time, it is a part for connecting the DC—DC converter 80a. The DC—DC converter 80a is connected to the lower flat surface of the base part 31c of the heat sink 30c, that is, to the surface on which the radiator fins 32c are not formed, and at the same time, the circuit board 100c is connected thereto via the block 60c. The screw holes 74 are provided in the outer periphery of the heat sink 30c.

Similar to the first embodiment, the block 60c is made of materials with high thermal conductivity such as aluminum and copper and is used for the connection to the heat sink 30c according to the height of the objects to be cooled on the circuit board 100c. The layout of the block 60c is determined depending on the layout and shape of the objects to be cooled on the circuit board 100c.

The DC—DC converter 80a is a unit to convert (decrease the voltage) the DC voltage supplied from the power supply section 5 and perform an adequate supply of the DC voltage to the LSI 51c. The DC—DC converter 80a has a lead wire 81 below it, and when this lead wire 81 is inserted into a through hole 82 of the circuit board 100c, it is connected to the wiring in the power supply plane. By taking into consideration the layout of the DC—DC converter 80a in the board 40c fitted with the heat sink, the positions of the power supply line and the through hole 82 are designed. The supply voltage from the power supply section 5 is inputted to the DC—DC converter 80a through a power supply common bus, the back plane 21, the power supply plane of the circuit board 100c, the through hole 82, and the lead wire 81. The voltage is converted in the DC—DC converter 80a, and inputted and supplied to the LSI 51c from the DC—DC converter 80a through the lead wire 81, the through hole 82, the power supply plane of the circuit board 100c, and the input terminal of the LSI 51c.

In the connection and fixation of the DC—DC converter 80a to the heat sinks 30c, the screws and the like as the DC—DC converter connection means are used, and the upper surface of the DC—DC converter 80a contacts to the lower flat surface of the base part 31c. In this connection and fixation, the thermal conduction sheet 71c is interposed between the lower flat surface of the base part 31c and the upper surface of the DC—DC converter 80a. Similar to the case of the first embodiment, the thermal conduction sheet 71c plays a roll of a buffer. The DC—DC converter connection means is designed to screw one or more parts of the DC—DC converter 80a to the base part 31c of the heat sink 30c.

Also, the position of the DC—DC converter 80a is above the flat surface of the circuit board 100c, on the lower flat surface of the base part 31c of the heat sink 30 and in the vicinity of the LSI 51c as a power supply target, more specifically, the position capable of reducing a length of the power supply path. In this case, particularly, it is arranged above the area in the vicinity of one side of the LSI 51c, to which the wiring area 52c as the object to be cooled is not connected, on the circuit board 100c. This is a position corresponding to the position of the through hole 82 on the circuit board and is in an area other than that connected to the objects to be cooled on the circuit board 100c via the block 60c in the flat surface of the base part 31c. When seen as a whole, the DC—DC converter 80a is arranged obliquely above the LSI 51c as a power supply target. Note that, though the DC—DC converter 80a is arranged in the vicinity of one side of the LSI 51c, it is also possible to arrange the DC—DC converter 80a at a more separated position if the length of the power supply path is sufficiently short and the power supply can be stably performed.

The electromagnetic noises of the DC—DC converter 80a greatly affect the parts directly below it. In the third embodiment, since the DC—DC converter 80a is arranged away from the wiring mounted flat surface of the circuit board 100c, the influence of the electromagnetic noises on the wiring and the like on the circuit board 100c is reduced. Further, as a length of the power supply line between the DC—DC converter 80a and the LSI 51c as a power supply target becomes shorter, the operation of the LSI 51c can be stabilized by that much. In the third embodiment, since the DC—DC converter 80a is arranged obliquely above and in the vicinity of one side of the LSI 51c, the power supply line becomes sufficiently short, and the influence of the noises directly below the DC—DC converter 80a can be reduced. Further, the DC—DC converter 80a comes into contact with the heat sink 30c so as to be directly cooled.

Note that, according to the structure of the third embodiment, the area directly below the DC—DC converter 80a is not directly cooled by the heat sink 30c. Consequently, the design should be made in advance so that the wiring and the like for the high-speed signal required to be cooled on the circuit board 100c are not arranged in this area.

The procedure of assembling the board 40c fitted with the heat sink will be described. Similar to the first embodiment, the worker connects the circuit board 100c having the objects to be cooled to the heat sink 30c via one or more blocks 60c. Then, the worker connects and fixes the circuit board 100c, the heat sink 30c, one or more blocks 60c, the DC—DC converter 80a, and other parts by the screws and the like. First, the worker connects and fixes the DC—DC converter 80a on the lower flat surface of the base part 31c of the heat sink 30c so as to be located at the position of the through hole 82 of the circuit board 100c by the screws and the like, and at the same time, the worker connects the block 60c so as to match with the layout of the objects to be cooled on the circuit board 100c.

Similar to the first embodiment, the worker makes the lower flat surface of the base part 31c of the heat sink 30c opposed to the upper flat surface (the side having the objects to be cooled) of the circuit board 100c and interposes the block 60c therebetween on the objects to be cooled, and then, fixes the whole by the heat sink fixture 73, the screw holes 74, the screws 75 and the like. In this way, the space is filled with the solid block 60c and the difference in height of the objects to be cooled is compensated, and in this manner, the heat is moved from the objects to be cooled to the heat sink 30c. Further, by inserting and connecting the lead wire 81 of the DC-Dc converter 80a into the through hole 82 of the circuit board 100c at this time, the DC—DC converter 80a and the circuit board 100c are connected through the wiring in the power supply plane.

Under the above-described structure, the whole circuit board 100c is connected by one heat sink 30c having the flat surface with almost the same size as the board, and a plurality of objects to be cooled, that is, the LSI 51c and the wiring area 52c are collectively cooled. Also, power is supplied to the LSI 51c from the DC—DC converter 80a connected to the lower surface of the heat sink 30c through the wiring.

As the advantages of the structure of the third embodiment described above, since the DC—DC converter 80a is arranged away from the surface of the circuit board 100c, the influence given to the signal in the wiring directly below the DC—DC converter 80a by the electromagnetic noises generated from the DC—DC converter 80a is reduced, thereby reducing the degradation of the transfer signal. Consequently, a stable data transfer can be performed on the circuit board 100c. At the same time, since the distance from the DC—DC converter 80a to the LSI 51c is short, the response when the voltage fluctuation of the LSI 51c is detected and corrected is speeded up, and stable voltage supply to the LSI 51c can be achieved. Further, since the DC—DC converter 80a is cooled by the heat sink 30c, it is possible to contribute to stabilization of the DC—DC converter 80a.

As a modification example of the third embodiment, based on the structure of the second embodiment, the structure in which the DC—DC converter 80a is additionally provided to the structure of the second embodiment is also available. That is, the DC—DC converter 80a is connected to one outer flat surface of the heat sink 30b, and the power is supplied from the DC—DC converter 80a to the electronic components such as the LSI and the like on the circuit board 100. Further, another DC—DC converter 80a may be connected to another outer flat surface of the heat sink 30b, and the power can be supplied from the DC—DC converter 80a to the LSI and the like on the other circuit board 100.

Fourth Embodiment

Figure 17:
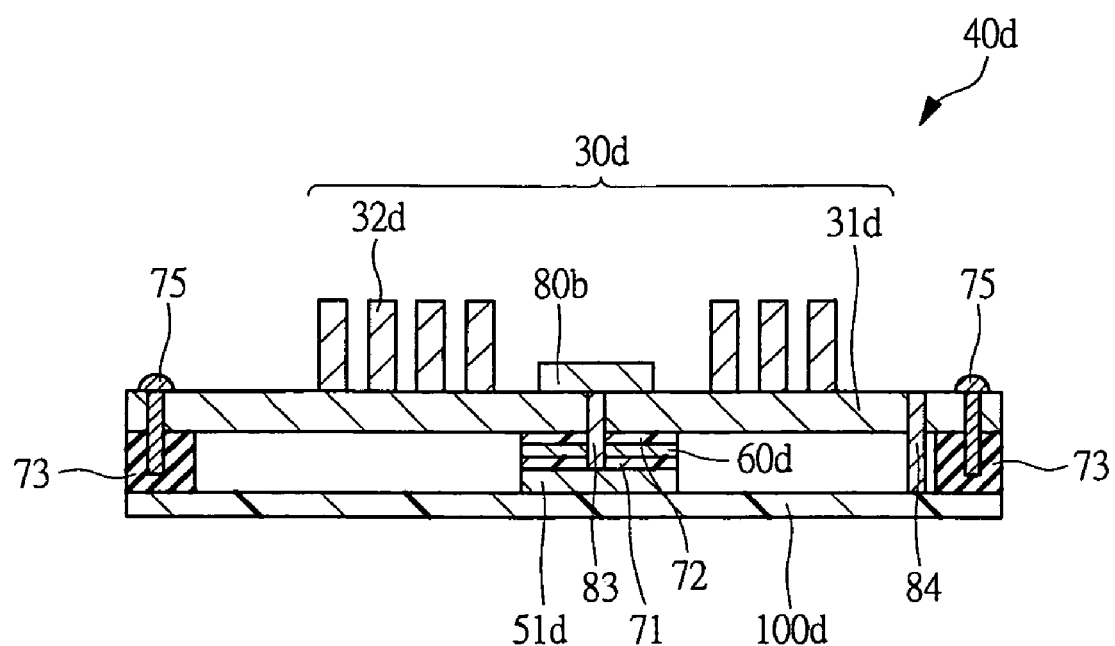
FIG. 17 is a sectional view of the board fitted with the heat sink in the disk array system according to the fourth embodiment of the present invention.
Figure 18A:
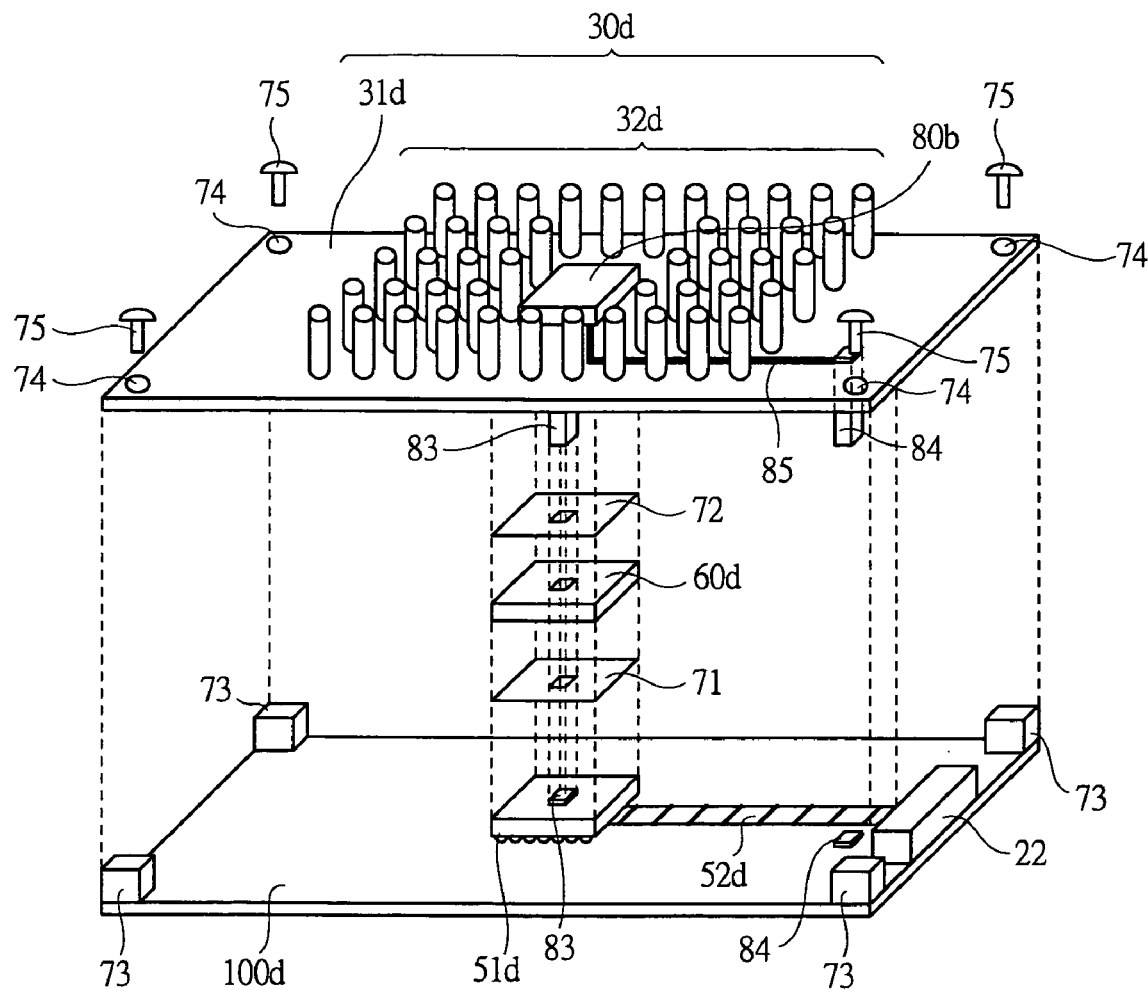
FIG. 18A is a perspective view showing the disassembled state of the board fitted with the heat sink in the disk array system according to the fourth embodiment of the present invention.
Figure 18B:
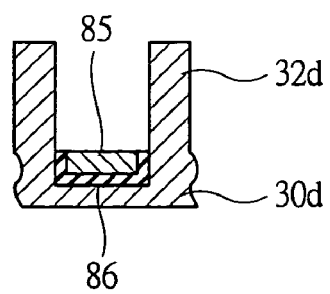
FIG. 18B is a sectional view showing the wiring in the heat sink in the disk array system according to the fourth embodiment of the present invention.

Next, a disk array system according to a fourth embodiment of the present invention will be described. FIG. 17 is a sectional view of a circuit board 40d fitted with a heat sink in the disk array system of the fourth embodiment. Further, FIG. 18 is a perspective view showing a disassembled state of the board 40d fitted with the heat sink in the disk array system of the fourth embodiment. FIG. 18A shows a perspective view thereof, and FIG. 18B shows a sectional view showing a setting state of a power supply/ground wiring 85. The basic structure of the disk array system according to the fourth embodiment corresponds to the structure of the above-described disk array system 1.

Accompanied with the low voltage tendency of the LSI, a plurality of power supply types for supplying power to the LSI is required in some cases. Therefore, it is necessary to allow the circuit board to have a power supply plane corresponding to various types of the power supply types. As a result, the mounting efficiency of the circuit board is deteriorated. In the structure of the third embodiment, the power is supplied to the LSI 51c from the DC—DC converter 80a through the power supply plane of the circuit board. Consequently, because of the power supply plane required in such a way, the mounting efficiency of the circuit board 100c cannot be improved than the way it used to be.

In the fourth embodiment, based on the structure of the first embodiment, the DC—DC converter 80b, which is a unit for stably supplying the power to electronic components such as LSI and the like on a circuit board 100, is installed. Different from the third embodiment, the DC—DC converter 80b for supplying power to an LSI 51d on a circuit board 100d is connected to the upper flat face (the side where radiator fins 31d are provided) of a base part 31d of a heat sink 30d in the fourth embodiment. Then, power is directly supplied from the DC—DC converter 80b to the LSI 51d without using the wiring in the power supply plane of the circuit board 100d. The DC—DC converter 80b and the LSI 51d as a power supply target are connected via an opening provided in the heat sink 30d and a connector 83, and the power supply therebetween is performed. Also in the fourth embodiment, the DC—DC converter 80b is arranged at the position away from the wiring mounted surface on the circuit board 100d. The connecting position of the DC—DC converter 80b in the heat sink 30d is a position capable of reducing a length of the power supply path above the LSI 51c as a power supply target.

The board 40d fitted with heat sink mainly composed of the circuit board 100d, the heat sink 30d, a block 60d, and the DC—DC converter 80b. Further, as the parts for the wiring, a DC—DC converter output connector 83, a DC—DC converter input connector 84, the power supply/ground wiring 85, and the like are also provided. In addition, as parts or members for connection and fixation, the board 40d fitted with the heat sink has a thermal conduction sheet 71, a double-faced tape (low resistance double-faced tape) 72, heat sink fixtures (screw support) 73, screw holes 74, and screws 75. Further, as DC—DC converter connection means (not shown), it has a connection and fixation screws and the like.

On the circuit board 100d, as the objects to be cooled, there are one or more LSIs 51d and one or more wiring areas 52d. The LSI 51d is an electronic component for performing the high-speed transfer process and is connected to the wiring area 52d composed of the wirings to be the transmission paths of a high-speed signal. The power input connector 83 is provided in the upper surface of the LSI 51d and this is connected to the connector 83 on the side of the DC—DC converter 80b. The wiring area 52d on the circuit board 100d is connected to a back plane connector 22 and is further connected to other circuit boards 100 through the wirings in the back plane 21. The heat sink fixture 73 is provided in the outer periphery of the circuit board 10d. Note that, FIGS. 17 and 18 show an example in which only one LSI 51d and only one wiring area 52d as the objects to be cooled are provided on the circuit board 10d, and the illustration of other electronic components, wirings and the like which are not the objects to be cooled is omitted. Also, an example in which only one LSI 51d as a power supply target is provided is shown. Further, the illustration of the block 60d, the thermal conduction sheet 71, the double-faced tape 72 and the like which are connected to the wiring area 52d is omitted here.

Further, different from the third embodiment, since power is supplied from the heat sink 30d side to the LSI 51d on the circuit board 10d, it is unnecessary to provide almost all the wirings for supplying power to the LSI 51d through the DC—DC converter 80b in the power supply plane.

The DC—DC converter input connector 84 is provided on an optional position on the circuit board 100d and the heat sink 30d. This is a power supply input connector to connect the circuit board 100d side and the heat sink 30d side for an input voltage/ground supply to the DC—DC converter 80b from the power supply section 5 and the back plane 21. The connector 84 is composed of the side connected to the wiring of the circuit board 100d and the side connected to the base part 31d of the heat sink 30d. Further, the wiring from the power supply section 5 and the back plane 21 is connected to the connector 84 in the circuit board 100d through the back plane connector 22. Each connector 84 of the circuit board 100d side and the heat sink 30d side is connected, and an input voltage/ground supply is performed from the power supply section 5 and the back plane 21 to the DC—DC converter 80b through this connector and the power supply/ground wiring 85 on the base part 31d.

The power supply line from the DC—DC converter 80b to the LSI 51d is inputted to the LSI 51d as a power supply target through the DC—DC converter output connector 83 from the DC—DC converter 80b. The connector 83 is a power supply output connector to the LSI 51*d* from the DC—DC converter 80*b* and is composed of the side connected to the output terminal below the DC—DC converter 80*b* and the side connected to the input terminal of the LSI. The connectors 83 and 84 are fixed to the heat sink 30*d* by such means as the screws and the like.

The heat sink 30*d* has the base part 31*d*, the radiator fins 32*d* and a DC—DC converter connection means (not shown). Though it has almost the same structure as the heat sink 30*a*, it is different from the heat sink 30*a* in that the DC—DC converter 80*b* can be connected to the base part 31*d* through the DC—DC converter connection means. The heat sink 30*d* is a part for collectively cooling the LSI 51*d* and the wiring area 52*d* as the objects to be cooled on the circuit board 100*d*, and at the same time, it is a part for connecting the DC—DC converter 80*b*. The DC—DC converter 80*b* is connected to the upper flat surface of the base part 31*d* of the heat sink 30*d*, that is, to the surface in which the radiator fins 32*d* are provided, and the circuit board 100*d* is installed on the lower flat surface of the base part 31*d* via the block 60*d*. The screw holes 74 are provided in the outer periphery of the heat sink 30*d*.

Within a part of an area for the radiator fin 32*d* in the heat sink 30*d*, there is a flat surface area in which individual fins are not provided so that the DC—DC converter 80*b* can be mounted. Further, an opening is provided in the base part 31*d* of the heat sink 30*d* at the position corresponding to the position in which the DC—DC converter 80*b* is arranged, and the DC—DC converter output connector 83 is inserted and connected into the opening. Also, an opening is provided in the base part 31*d* of the heat sink 30*d* at a position corresponding to the position of the connector 84 in the circuit board 10*d*, and the DC—DC converter input connector 84 is inserted and connected through this opening.

FIG. 18B is a sectional view showing a setting state of the power supply/ground wiring 85 in the heat sink 30*d*. In the upper flat surface of the base part 31*d* of the heat sink 30*d*, the wiring is formed by the power supply/ground wiring 85 from the connector 84 to the DC—DC converter 80*b*. The power supply ground wiring 85 passes through among individual fins in the area for the radiator fin 32*d*. A layer serving as an insulator 86 is provided among individual fins in the area for the radiator fin 32*d* on the upper surface of the base part 31*d*. The power supply/ground wiring 85 is formed on the layer of the insulator 86.

Similar to the first embodiment, the block 60*d* is made of materials with high thermal conductivity such as aluminum and copper and is used for the connection to the heat sink 30*d* according to the height of the objects to be cooled on the circuit board 100*d*. The layout of the block 60*c* is determined depending on the layout and shape of the objects to be cooled on the circuit board 100*d*. Further, of the blocks 60*d*, the block 60*d* arranged on the LSI 51*d* serving as the object to be cooled and the power supply target has an opening through which the DC—DC converter output connector 83 is connected to the LSI 51*d*. Similarly, the thermal conduction sheet 71 and the double-faced tape 72 arranged in accordance with the block 60*d* also have a corresponding opening. Note that, though the opening is provided in the block 60*d*, the thermal conduction sheet 71, and the double-faced tape 72 here, it is also possible to form the structure in which a plurality of blocks 60*d* without the opening are combined and arranged in the vicinity of the DC—DC converter output connector 83.

The DC—DC converter 80*b* is a unit to convert (decrease the voltage) the DC voltage supplied from the power supply section 5 and perform an adequate supply of the DC voltage to the LSI 51*d*. The DC—DC converter 80*b* has the DC—DC converter output connector 83 below it, and when this DC—DC converter output connector 83 is connected to the corresponding DC—DC converter output connector 83 on the LSI 51*d*, the power supply line is set in a connected state.

By taking into consideration the layout of the LSI 51*d* as a power supply target on the circuit board 100*c*, the layout of the DC—DC converter 80*b*, the position of the opening and the like in the heat sink 30*d* are designed. The supply voltage from the power supply section 5 is inputted into the DC—DC converter 80*b* through a power supply common bus, the back plane 21, the DC—DC converter input connector 84 on the circuit board 100*d* side, the DC—DC converter input connector 84 on the heat sink 30*d* side, and the power supply/ground wiring 85. The voltage is converted by the DC—DC converter 80*b* and is inputted and supplied to the LSI 51*d* from the DC—DC converter 80*b* through the DC—DC converter output connector 83 and the DC—DC converter output connector 83 on the LSI 51*d* side.

In the connection and fixation of the DC—DC converter 80*b* to the heat sinks 30*d*, the screws and the like as the DC—DC converter connection means are used, and the lower surface of the DC—DC converter 80*b* contacts to the upper flat surface of the base part 31*d* and the DC—DC converter output connector 83 is inserted into the opening in the base part 31*d*. In this connection and fixation, the thermal conduction sheet 71 (not shown) may be interposed between the upper flat surface of the base part 31*d* and the lower surface of the DC—DC converter 80*b*. The DC—DC converter connection means is designed to screw one or more parts of the DC—DC converter 80*b* to the base part 31*d* of the heat sink 30*d*.

Also, the position of the DC—DC converter 80*b* is above the flat surface of the circuit board 100*d*, on the upper flat surface of the base part 31*d* of the heat sink 30*d* and above the LSI 51*d* as a power supply target, more specifically, the position capable of reducing a length of the power supply path. In this case, particularly, the DC—DC converter 80*b* is arranged just above the LSI 51*d* so that they are overlapped in the direction vertical to the board. Note that, though the DC—DC converter 80*b* is arranged at the position almost just above the LSI 51*d*, it is also possible to arrange the DC—DC converter 80*b* at a more separated position if the length of the power supply path is sufficiently short and the power supply can be stably performed. That is, the DC—DC converter 80*b* and the LSI 51*d* may be arranged at the positions so that they are partially overlapped when seen from above the board flat surface.

The electromagnetic noises of the DC—DC converter 80*b* greatly affect the parts directly below it. In the fourth embodiment, since the DC—DC converter 80*b* is arranged away from the wiring mounted flat surface of the circuit board 10*d*, the influence of the electromagnetic noises on the wiring and the like on the circuit board 100*d* is reduced. Further, as a length of power supply line between the DC—DC converter 80*b* and the LSI 51*d* as a power supply target becomes shorter, the operation of the LSI 51*d* can be stabilized by that much. In the fourth embodiment, since the DC—DC converter 80*b* is arranged almost just above the LSI 51*d*, the power supply line becomes sufficiently short, and the influence of the noises directly below the DC—DC converter 80*b* can be reduced. Further, the DC—DC converter 80*b* comes into contact with the heat sink 30*d* so as to be directly cooled.

The procedure of assembling the board 40*d* fitted with the heat sink will be described. Similar to the first embodiment, the worker connects the circuit board 100d having the objects to be cooled to the heat sink 30d via one or more blocks 60d. Then, the worker connects and fixes the circuit board 10d, the heat sink 30d, one or more blocks 60d, the DC—DC converter 80b, and other parts by the screws and the like.

First, the worker connects and fixes the DC—DC converter 80b on the upper flat surface of the base part 31d of the heat sink 30d by the screws and the like so that it can be located at the corresponding position of the LSI 51d as a power supply target on the circuit board 100d. Also, the connector 83 is connected to the output terminal at the lower portion of the converter 80b. Further, the worker connects the block 60d to the lower flat surface of the base part 31d so as to match with the layout of the objects to be cooled on the circuit board 10d.

Similar to the first embodiment, the worker makes the lower flat surface of the base part 31d of the heat sink 30d opposed to the upper flat surface (the side having the objects to be cooled) of the circuit board 100d and interposes the block 60d therebetween on the objects to be cooled, and then, fixes the whole by the heat sink fixture 73, the screw holes 74, the screws 75 and the like. At this time, the two connectors 83 are mutually connected. Further, with regard to the LSI 51d as a power supply target, the connector 83 is connected to the LSI 51d through the opening of the block 60d above and the like, and thus, the DC—DC converter 80b and the LSI 51d are connected through the power supply line. Also, one end of the power supply/ground wiring 85 is connected through the input terminal of the DC—DC converter 80b, and the other end is connected to the connector 84 of the base part 31d. By the mutual connection of the two connectors 84, the DC—DC converter 80c and the circuit board 100d are connected through the power supply line. In this way, the space is filled with the solid block 60d and the difference in height of the objects to be cooled is compensated, and in this manner, the heat is moved from the objects to be cooled to the heat sink 30d.

Under the above-described structure, the whole circuit board 100d is connected by one heat sink 30d having the flat surface with almost the same size as the board, and a plurality of objects to be cooled, that is, the LSI 51d and the wiring area 52d are collectively cooled. Also, power is supplied to the LSI 51d from the DC—DC converter 80b connected to the upper surface of the heat sink 30d through the wiring.

As the advantages of the structure of the fourth embodiment described above, since the DC—DC converter 80b is arranged away from the surface of the circuit board 100d, the influence given to the signal in the wiring directly below the DC—DC converter 80b by the electromagnetic noises generated from the DC—DC converter 80b is reduced, thereby reducing the degradation of the transfer signal. Consequently, a stable data transfer can be performed on the circuit board 100d. At the same time, since the power supply distance from the DC—DC converter 80b to the LSI 51d is short, the response when the voltage fluctuation of the LSI 51d is detected and corrected is speeded up, and stable voltage supply to the LSI 51d can be achieved.

In addition, it becomes unnecessary to mount the DC—DC converter on the circuit board 10d, and the mounting efficiency of the circuit board 100d can be improved. Further, for this reason, the power supply layer in the circuit board 100d can be reduced, and the board can be made thin. In addition, since the DC—DC converter 80b is cooled by the heat sink 30d, it is possible to contribute to the stabilization of the DC—DC converter 80b.

As a modification example of the fourth embodiment, based on the structure of the second embodiment, the structure in which the DC—DC converter is additionally provided to the structure of the second embodiment is also available. That is, one DC—DC converter is connected on an inner flat surface of one base part of the heat sink having the two base parts, and the power is supplied from the DC—DC converter to the LSI on the circuit board 100. Further, another DC—DC converter is connected on an inner flat surface of the other base part of the heat sink, and the power is supplied from the DC—DC converter to the LSI on the other circuit board 100 connected to this base part.

Fifth Embodiment

Figure 19:
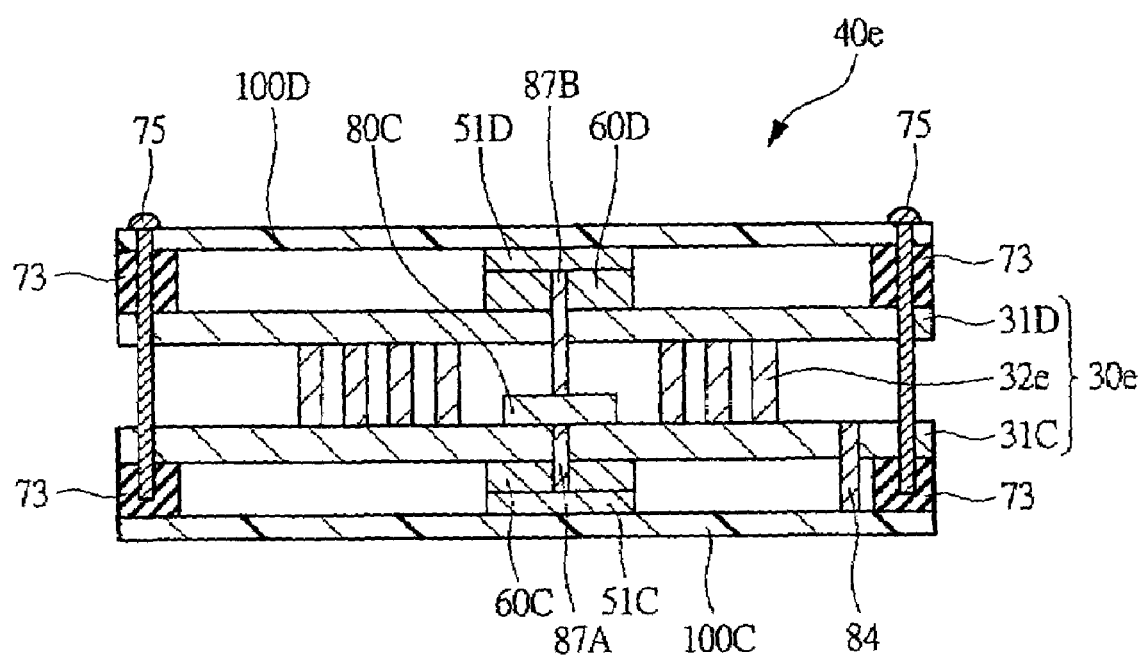
FIG. 19 is a sectional view showing the board fitted with the heat sink in the disk array system according to the fifth embodiment of the present invention.
Figure 20:
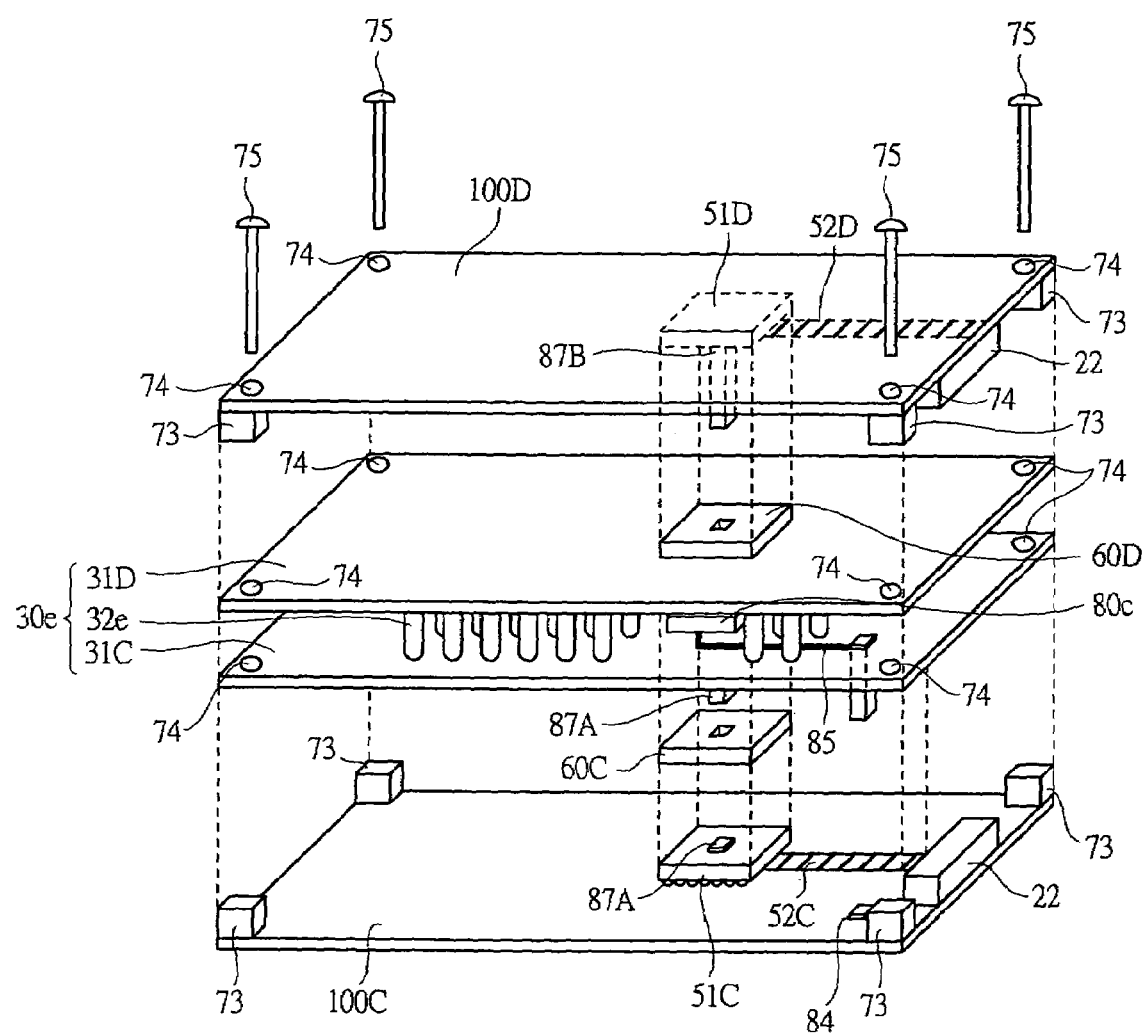
FIG. 20 is a perspective view showing the disassembled state of the board fitted with the heat sink in the disk array system according to the fifth embodiment of the present invention.

Next, a disk array system according to a fifth embodiment of the present invention will be described below. FIG. 19 is a sectional view of a board 40e fitted with a heat sink in the disk array system according to the fifth embodiment. FIG. 20 is a perspective view showing a disassembled state of the board 40e fitted with the heat sink in the disk array system according to the fifth embodiment. The basic structure of the disk array system according to the fifth embodiment corresponds to the structure of the above-described disk array system 1.

In the fifth embodiment, based on the structure of the second embodiment, two circuit boards 100 are cooled by one heat sink, and one DC—DC converter is arranged above the LSI of each circuit board 100 via a base part of the heat sink, and a power is supplied to the two LSI of each circuit board from this one DC—DC converter. The two LSIs are arranged at almost identical positions on the opposed circuit boards with interposing the DC—DC converter therebetween.

A combination of the structure of the second embodiment and the structure of the fourth embodiment will be considered. When the DC—DC converter is installed for each LSI on the circuit board, the voltage supplied to each LSI becomes not always uniform due to the influence of the voltage fluctuation and the like. Therefore, in the case where the data transfer is performed between the LSIs, the impedance of a send/receive buffer changes due to the difference of an operating voltage, and thus, reflection noises arise due to impedance mismatch, and the signal is degraded. As a result, there is the possibility that a high-speed data transfer cannot be performed.

In the fifth embodiment, circuit boards 100C and 100D are designed such that the positions of the LSIs 51C and 51D serving as the objects to be cooled and power supply targets on the two circuit boards 100c and 100d become the almost identical position when the circuit boards are in an opposed state. In this structure, one heat sink 30e is interposed and connected between two circuit boards 100C and 100D. In this structure, in the inner flat surface of either base part of the heat sink 30e which has two base parts 31C and 31D, one DC—DC converter 80c is installed at the position corresponding to the LSIs 51C and 51D located at the almost identical position. The power is directly supplied to the two LSIs 51C and 51D from the DC—DC converter 80c at almost the same voltage without using the wirings in the power supply plane.

The circuit board 40e fitted with the heat sink is mainly composed of the circuit boards 100C and 100D, the heat sink 30e, blocks 60C and 60D, and the DC—DC converter 80c. Further, as the parts for the wirings, the circuit boards has DC—DC converter output connectors 87A and 87B, a DC—DC converter input connector 84, a power supply/ ground wiring 85 in the heat sink 30e. Also, the circuit board 40e fitted with the heat sink has a thermal conduction sheet 71, a double-faced tape (low resistance double faced tape) 72, a heat sink fixture (screw support) 73, screw holes 74, screws 75 and the like as the parts or the members for the connection and fixation. In addition, as DC—DC converter connection means (not shown), the board has connecting and fixing screws and the like.

On the circuit board 100C, one or more LSIs 51C and one or more wiring areas 52C are provided as the objects to be cooled. The LSI 51C is an electronic component for performing a high-speed data transfer process, and the wiring area 52C composed of the wirings to be the transmission paths of a high-speed signal is connected to the LSI 51C. The LSI 51C is a power supply target from the DC—DC converter 80c. A power supply input connector 87A is provided on the upper surface of the LSI 51C, and the power supply input connector 87A is connected to a connecter 87A on the DC—DC converter 80c side. The wiring area 52C on the circuit board 100C is connected to a back plane connector 22 and is further connected to the circuit board 100D or other circuit board 100 through the wiring in the back plane 21. The heat sink fixture 73 is provided in the outer periphery of the circuit board 100C.

The same is true of the circuit board 100D, and it has one or more LSI 51D and one or more wiring areas 52D as the objects to be cooled. The LSI 51D is a power supply target from the DC—DC converter 80c. The LSI 51C and 51D are mounted so that they are located at opposite positions in a state where the circuit boards 100C and 100D are opposed to each other. Note that, in FIGS. 19 and 20, an example in which only one LSI 51C (51D) and only one wiring area 52C (52D) are provided as the objects to be cooled on the circuit board 100C (100D) is shown, and the illustration of other electronic components, wirings and the like which are not the objects to be cooled is omitted. Further, an example in which only one LSI 51C (LSI D) as the power supply target is provided is shown. Further, the illustration of the block 60C (60D), the thermal conduction sheet 71, the double-faced tape 72 and the like connected to the wiring area 52C (52D) is omitted here.

Further, since the power is supplied to the LSI 51C from the heat sink 30e side in the circuit board 100C, it is unnecessary to provide almost all the wirings for supplying power to the LSI 51C through the DC—DC converter 80c in the power supply plane. The same is true of the circuit board 100D.

The DC—DC converter input connector 84 is provided on an optional position on the circuit board 100C and one base part 31C (on the side where the DC—DC converter 80c is provided) of the heat sink 30e. This is a power supply input connector to connect the circuit board 100C side and the heat sink 30e side for an input voltage/ground supply to the DC—DC converter 80c from the power supply section 5 and the back plane 21. The connector 84 is composed of the side connected to the wiring of the circuit board 100C and the side connected to the base part 31C of the heat sink 30e. Further, the wiring from the power supply section 5 and the back plane 21 is connected to the connector 84 in the circuit board 100C through the back plane connector 22. Each connector 84 of the circuit board 100C side and the heat sink 30e side is connected, and an input voltage/ground supply is performed from the power supply section 5 and the back plane 21 to the DC—DC converter 80c through this connector and the power supply/ground wiring 85 on the base part 31C.

The power supply line from the DC—DC convert 80c to the LSI 51C is inputted to the LSI 51C as a power supply target from the DC—DC converter 80c through the DC—DC converter output connector 87A. The connector 87A is a connector for the power supply output from the DC—DC converter 80c to the LSI 51C and is composed of the side connected to an output terminal below the DC—DC converter 80c and the side connected to an input terminal of the LSI 51C.

Similarly, the power supply line from the DC—DC convert 80c to the LSI 51D is inputted to the LSI 51D as a power supply target from the DC—DC converter 80c through the DC—DC converter output connector 87B. The connector 87B is a connector for the power supply output from the DC—DC converter 80c to the LSI 51D and is composed of the side connected to an output terminal on the DC—DC converter 80c and the side connected to an input terminal of the LSI 51D. The connectors 84, 87A and 87B are fixed to the heat sink 30e by means such as screws and the like.

The heat sink 30e has two base parts 31C and 31D, the radiator fins 32d and a DC—DC converter connection means (not shown). Though it has almost the same structure as the heat sink 30b, it is different from the heat sink 30b in that the DC—DC converter 80c can be connected to the base parts 31C and 31D through the DC—DC converter connection means. The heat sink 30e is a part for collectively cooling the LSIs 51C and 51D and the wiring areas 52C and 52D as the objects to be cooled on the circuit boards 100C and 100D, and at the same time, it is a part for connecting the DC—DC converter 80c. The DC—DC converter 80c is connected to the inner flat surface of the base part 31C of the heat sink 30e, that is, to the surface in which the radiator fins 32d are provided, and the circuit board 100C is installed on the outer flat surface of the base part 31C via the block 60D. The screw holes 74 are provided in the outer periphery of the base parts 31C and 31D of the heat sink 30e.

Also, within the area of the radiator fin 32e in the heat sink 30e, there is a flat surface area in which individual fins are not provided in advance so that the DC—DC converter 80c can be mounted on the inner flat surface. Here, a structure is shown as an example, in which the individual fins are not provided in the mounting position of the DC—DC converter 80c and in the area on the front side of the DC—DC converter 80c within the area for the radiator fin 32e of the heat sink 30e. Further, an opening is provided in the base parts 31C and 31D of the heat sink 30e at the position corresponding to the position at which the DC—DC converter 80c is arranged, and the DC—DC converter output connectors 87A and 87B are inserted and connected into the opening. Also, an opening is provided in the base part 31C of the heat sink 30e at the position corresponding to the position of the connector 84 in the circuit board 100C, and the DC—DC converter input connector 84 is inserted and connected through this opening.

The power supply/ground wirings 85, the connecter 84 and the like for the DC—DC converter input voltage supply are provided on the inner flat surface of one base part (31C in this case) of the heat sink 30e to which the DC—DC convert 80c is connected. However, it is unnecessary to provide those elements on the other base part (31 D in this case). The power supply/ground wiring 85 is provided on the inner flat surface of the base part 31C of the heat sink 30e in the same manner as that of the fourth embodiment. That is, the section from the connector 84 to the DC—DC converter 80c is wired by the power supply/ground wiring 85. The power supply/ground wiring 85 passes through among individual fins in the area for the radiator fin 32e. A layer serving as an insulator 86 is provided among individual fins in the area for the radiator fin 32e on the upper surface of the base part 31C. The power supply/ground wiring 85 is formed on the layer of the insulator 86.

Similar to the first embodiment, the blocks 60C and 60D are made of materials with high thermal conductivity such as aluminum and copper and are used for the connection to the heat sink 30e according to the height of the objects to be cooled on the circuit boards 100C and 100D. The layout of the blocks 60C and 60D is determined depending on the layout and shape of the objects to be cooled on the circuit boards 100C and 100D. Further, of the blocks 60C and 60D, the blocks 60C and 60D arranged on the LSIs 51C and 51D serving as the objects to be cooled and power supply targets have an opening through which the connectors 87A and 87B are connected to the LSIs 51C and 51D. Similarly, the thermal conduction sheet 71 and the double-faced tape 72 arranged in accordance with the blocks 60C and 60D also have a corresponding opening.

The DC—DC converter 80c is a unit to convert (decrease the voltage) the DC voltage supplied from the power supply section 5 and perform an adequate supply of the DC voltage to the LSIs 51C and 51D. Almost equal voltage is supplied to the LSIs 51C and 51D. The DC—DC converter 80c has the DC—DC converter output connector 87A below it, and when this connector 87A is connected to the corresponding connector 87A on the LSI 51C, the power supply line is set in a connected state. Similarly, the DC—DC converter 80c has the DC—DC converter output connector 87B thereon, and when this connector 87B is connected to the corresponding connector 87B on the LSI 51D, the power supply line is set in a connected state.

By taking into consideration the layout of the LSIs 51C and 51D as the power supply targets on the circuit boards 100C and 100D, the layout of the DC—DC converter 80c, the position of the opening and the like in the heat sink 30e are designed. The supply voltage from the power supply section 5 is inputted into the DC—DC converter 80c through a power supply common bus, the back plane 21, the connector 84 on the circuit board 100C side, the connecter 84 on the heat sink 30e side, and the power supply/ground wiring 85. The voltage is converted by the DC—DC converter 80c and is inputted and supplied to the LSIs 51C and 51D from the DC—DC converter 80c through the connecters 87A and 87B.

In the connection and fixation of the DC—DC converter 80c to the heat sinks 30e, the screws and the like as the DC—DC converter connection means are used, and the lower surface of the DC—DC converter 80c contacts to the inner flat surface of the base part 31C and the DC—DC converter output connector 87A is inserted into the opening in the base part 31C. In this connection and fixation, the thermal conduction sheet 71 (not shown) may be interposed between the upper flat surface of the base part 31C and the lower surface of the DC—DC converter 80c. The DC—DC converter connection means is designed to screw one or more parts of the DC—DC converter 80c to the base part 31C of the heat sink 30e.

Also, the position of the DC—DC converter 80C is above the flat surface of the circuit board 100C, on the inner flat surface of the base part 31C of the heat sink 30e and between the LSIs 51C and 51D as the power supply targets, more specifically, the position capable of reducing a length of the power supply path. In this case, particularly, the DC—DC converter 80c is arranged just above the LSIs 51C and 51D so that they are overlapped in the direction vertical to the board. Note that, though the DC—DC converter 80c is arranged at the position almost just above the LSIs 51C and 51D, it is also possible to arrange the DC—DC converter 80c at a more separated position if the length of the power supply path is sufficiently short and the power supply can be stably performed. That is, the DC—DC converter 80c and the LSIs 51C and 51D may be arranged at the positions so that they are partially overlapped when seen from above the board flat surface.

The electromagnetic noises of the DC—DC converter 80c greatly affect the parts directly below it. In the fifth embodiment, since the DC—DC converter 80c is arranged away from the wiring mounted flat surface of the circuit boards 100C and 100D, the influence of the electromagnetic noises on the wiring and the like on the circuit boards 100C and 100D is reduced. Further, as a length of power supply line between the DC—DC converter 80c and the LSIs 51C and 51D as the power supply targets becomes shorter, the operation of the LSIs 51C and 51D can be stabilized by that much. In the fifth embodiment, since the DC—DC converter 80c is arranged almost just above the LSIs 51C and 51D, the power supply line becomes sufficiently short, and the influence of the noises directly below the DC—DC converter 80c can be reduced. Also, the DC—DC converter 80c comes into contact with the heat sink 30e so as to be directly cooled.

The procedure of assembling the board 40e fitted with the heat sink will be described. Similar to the second embodiment, the worker connects the two circuit boards 100C and 100D having the objects to be cooled to the heat sink 30e via one or more blocks 60C and 60D. Then, the worker connects and fixes the circuit boards 100C and 100D, the heat sink 30d, one or more blocks 60C and 60D, the DC—DC converter 80c, and other parts by the screws and the like.

First, the worker connects the DC—DC converter 80c to the heat sink 30e and connects one circuit board 100C of the two circuit boards. Then, the worker arranges the DC—DC converter 80c on the inner flat surface of the base part 31C of the heat sink 30e so that it is located at the corresponding positions of the LSIs 51C and 51D as the power supply targets on the circuit boards 100C and 100D and then connects and fixes them by the screws and the like. Further, the worker connects the connecter 87A to the output terminal below the DC—DC converter 80c. At the same time, the worker connects the block 60C to the outer flat surface of the base part 31C so as to match with the layout of the objects to be cooled on the circuit board 100C.

Similar to the second embodiment, the worker makes the outer flat surface of the base part 31C of the heat sink 30e opposed to the upper flat surface (the side having the objects to be cooled) of the circuit board 100C and interposes the block 60C therebetween on the objects to be cooled, and then, fixes the whole by the heat sink fixture 73, the screw holes 74, the screws 75 and the like. At this time, the two connectors 87A are mutually connected. Also, the two connectors 84 are mutually connected. With regard to the LSI 51C as a power supply target, the connector 87A is connected to the LSI 51C through the opening of the block 60C above the LSI 51C, and thus, the DC—DC converter 80c and the LSI 51C are connected through the power supply line. Also, one end of the power supply/ground wiring 85 is connected to the DC—DC converter 80c through the input terminal, and the other end is connected to the connector 84 of the base part 31C. By the mutual connection of the two connectors 84, the DC—DC converter 80c and the circuit board 100C are connected through the power supply line. In this way, the space is filled with the solid block 60C and the difference in height of the objects to be cooled is compensated, and in this manner, the heat is moved from the objects to be cooled to the heat sink 30c.

Next, the worker connects the block 60D to the outer flat surface of the base part 31D of the heat sink 30e so as to match with the layout of the objects to be cooled on the other circuit board 100D. Then, the worker makes the outer flat surface of the base part 31D of the heat sink 30e opposed to the upper flat surface (the side having the objects to be cooled) of the circuit board 100D and interposes the block 60D therebetween on the objects to be cooled, and then, fixes the whole by the heat sink fixture 73, the screw holes 74, the screws 75 and the like. At this time, the LSI 51C, the DC—DC converter 80c and the LSI 51D are connected so that they are arranged at almost identical positions in the direction vertical to the flat surface of the boards. Also, the two connecters 87B are mutually connected. With regard to the LSI 51D as a power supply target, the connector 87B is connected to the LSI 51D through the opening of the block 60D above the LSI 51D, and thus, the DC—DC converter 80c and the LSI 51D are connected through the power supply line. In this way, the space is filled with the solid block 60D and the difference in height of the objects to be cooled is compensated, and in this manner, the heat is moved from the objects to be cooled to the heat sink 30c.

Under the above-described structure, the whole of the two circuit boards 100C and 100D is connected by one heat sink 30e having the flat surface with almost the same size as the boards, and a plurality of objects to be cooled, that is, the LSI 51C and 51D and the wiring areas 52C and 52D are collectively cooled. Also, power is supplied to the LSIs 51C and 51D from the DC—DC converter 80c connected and arranged in the area for the radiator fin 32e inside the heat sink 30e through the wiring at almost equal voltage.

As the advantage of the structure of the fifth embodiment described above, since one DC—DC converter 80c is commonly used by the two LSIs 51C and 51D, the supply voltage to each of the LSIs 51C and 51D can be made almost equal. Consequently, when the data transfer is performed between the two LSIs 51C and 51D, the impedance mismatch due to the difference of the supply voltage can be prevented and the reflection noises can be reduced, and thus, it becomes possible to perform the high-speed data transfer. Further, since the DC—DC converter 80c is arranged away from the surface of the surfaces of the circuit boards 100C and 100D, the influence given directly below the DC—DC converter 80c by the electromagnetic noises generated from the DC—DC converter 80c can be reduced, and thus, it becomes possible to reduce the degradation of the transfer signal. Consequently, the stable data transfer can be performed on the circuit boards 100C and 100D. At the same time, since the length from the DC—DC converter 80c to the LSIs 51C and 51D is short, a response when detecting and correcting the voltage fluctuation of the LSIs 51C and 51D is speeded up, and the stable voltage supply to the LSIs 51C and 51D can be performed.

In addition, it becomes unnecessary to mount the DC—DC converter on the circuit boards 100C and 100D, and the mounting efficiency of the circuit boards 100C and 100D can be improved. Further, for this reason, the power supply layer in the circuit boards 100C and 100D can be reduced and the board can be made thin. In addition, since the DC—DC converter 80c is cooled by the heat sink 30e, it is possible to contribute to the stabilization of the DC—DC converter 80c.

The invention made by the inventors of this invention has been concretely described above based on the embodiments, the present invention is not limited to those embodiments, and it is clear to those skilled in the art that the invention can be modified variously without departing from the scope of the invention.

For example, with regard to the connection between the objects to be cooled on the circuit board 100 and the heat sink, it is also possible to form the structure in which the connection is made without using the blocks in some parts. For example, when a plurality of LSIs 51 as the objects to be cooled are provided, the highest LSI 51 can be directly connected to the heat sink without using the block. In this case, the height of the circuit board 40 fitted with the heat sink can be reduced by that much.

Also, for example, with regard to the connection between the objects to be cooled on the circuit board 100 and the heat sink, the structure having the space between the objects to be cooled and the heat sink without the block is also available. More specifically, in the case of some of the objects to be cooled, for example, the wiring area 52, the block is connected on the wiring area 52 via the double-faced tape 72 and the like, and this block is not connected to the connection flat surface of the heat sink but connected to the LSI 51 adjacent to the wiring area 52 or the block on the LSI 51. Also in this case, since the block on the wiring area 52 is connected to the heat sink via the LSI 51 and the block on the LSI 51, a heat transfer is performed. Although the wiring area 52 does not generate heat by itself, the temperature difference occurs due to the amount of process and positional relationship of the adjacent LSI 51 and a high temperature portion and a low temperature portion are created in the area. The block on the wiring area 52 contacts the adjacent LSI 51 or the block on the LSI 51, and by which the heat transfer is performed. Therefore, it plays a roll of reducing the temperature difference. The deviation of the temperature in the area is averaged and reduced through the block connected on the wiring area 52a.

Further, for example, the structure is also available in which the electronic components and the wiring area used in the high-speed process are taken as the objects to be cooled, and also, the electronic components used in an intermediate or a low speed process are also taken as the cooling objects which are lightly cooled in comparison to the electronic components used in the high-speed processing. When a thermal conductive block is connected to the wiring area and the electronic component and its wiring area used in the intermediate and low speed process, it is unnecessary for this block to have the thermal conductivity as high as the block arranged for the electronic components used in the high-speed processing. Hence, it is possible to use the block made of a material with the thermal conductivity lower than aluminum and copper for these parts used in the intermediate and low speed processing.

The present invention can be applied as the cooling method for the disk array system and the circuit board.

What is claimed is:

1. A disk array system, comprising:
    a controller having a plurality of circuit boards including
        a channel adaptor board, a switch board, a cache board
        and a disk adaptor board;
    a disk device controlled by said controller;
    a power supply section to supply a power to said circuit
        boards; and
    a fan for the ventilation in the system,
    wherein each of said circuit boards has objects to be
        cooled including at least one of an electronic component and a wiring area thereon, and said each circuit board is stored in a logic box in a state of being fitted with a heat sink with interposing a block with high conductivity therebetween, said heat sink has a base part having a connection flat surface which covers the whole of the upper flat surfaces of said objects to be cooled and has radiator fins, and said block has a shape coming in contact with the upper surfaces of the objects to be cooled on said each circuit board, and the connection flat surface of said heat sink and transmits a heat of said objects to be cooled to said heat sink.

2. The disk array system according to claim 1, wherein the base part of said heat sink has a plat-like shape and said connection flat surface on one side, and a plurality of cylindrical fins are provided in a matrix layout on the flat surface of the opposite side.

3. The disk array system according to claim 1, wherein, as said objects to be cooled, an integrated circuit part for performing a data transfer process as said electronic component and a wiring connected to said integrated circuit part as said wiring area to be a transmission path in said data transfer are provided on said circuit board, said block is composed of one or a plurality of blocks depending on the height and the upper surface shape so as to match with each of said integrated circuit part and the wiring, and said integrated circuit part and said wiring are connected to the connection flat surface of said heat sink by said one or plurality of blocks.

4. The disk array system according to claim 1, wherein a sheet having a thermal conductivity is interposed on the connection surface between the objects to be cooled on said circuit board and said block, and the connection surface between said block and said heat sink is connected by a double-faced tape having a low heat resistance.

5. The disk array system according to claim 1, wherein said circuit board and said heat sink are screwed at a plurality of places in the flat surfaces of both of them so that the whole including said block is fixed, and then, stored in said logic box in this state.

6. The disk array system according to claim 1, wherein the connection flat surface of said heat sink has almost the same size as that of the flat surface of said circuit board.

7. The disk array system according to claim 1, wherein the connection flat surface of said heat sink has a size equivalent to the minimum cooled areas for covering the whole of the upper surfaces of a plurality of objects to be cooled on said circuit board.

8. The disk array system according to claim 1, wherein said two circuit boards are paired, and the flat surfaces on the side having the objects to be cooled of said paired circuit boards are opposed to each other, and one or plural blocks with high thermal conductivity and one heat sink are interposed between the boards, and in this state, the boards are stored in said logic box, said heat sink has two base parts having the connection flat surface for connecting said pair of circuit boards and radiator fins, and a first block having a shape connected to the upper surfaces of the objects to be cooled on a first circuit board and a first connection flat surface and a second block having a shape connected to the upper surfaces of the objects to be cooled on a second circuit board and a second connection flat surface are provided as said blocks.

9. The disk array system according to claim 8, wherein two base parts of said heat sink are in the shape of a plate and in parallel with each other and have said connection flat surface on each outer flat surface thereof, and a plurality of said radiator fins are provided in a matrix layout and connected between the inner flat surfaces of said two base parts.

10. The disk array system according to claim 8, wherein, as said objects to be cooled, integrated circuit parts for performing the data transfer process as said electronic components and wiring connected to said integrated circuit parts as said wiring area to be the transmission path in said data transfer process are provided on said first and second circuit boards, and the data transfer is performed between said first and second circuit boards through the wiring in which said integrated circuit parts serve as said transmission path and the wiring in the back plane of said logic box.

11. The disk array system according to claim 8, wherein said pair of circuit boards and said heat sink are screwed at a plurality of places in the flat surfaces of both of them so that the whole including said block is fixed, and then, stored in said logic box in this state.

12. The disk array system according to claim 8, further comprising a DC—DC converter for performing the power supply to two electronic components which are opposed with interposing said heat sink therebetween in said one pair of circuit boards, wherein said DC—DC converter is installed in an installing area of said radiator fins of said heat sink in the vicinity of said two electronic components as the power supply targets, and a power is supplied to said two electronic components from said DC—DC converter through the openings and the power supply lines respectively provided in the two base parts of said heat sink.

13. The disk array system according to claim 12, wherein said DC—DC converter is installed on the surface opposite with the connection flat surface of one of the base part of said heat sink.

14. The disk array system according to claim 12, wherein, in said one pair of circuit boards, said two electronic components as the power supply targets are mounted at almost identical position on each flat surface of the boards with interposing said heat sink therebetween, and said DC—DC converter is arranged approximately right above said two electronic components as the power supply targets.

15. The disk array system according to claim 1, further comprising a DC—DC converter for performing a power supply to the electronic components on said circuit boards, wherein said DC—DC converter is installed on the connection flat surface of said heat sink in the vicinity of said electronic components as the power supply targets in a state where it is separated from the flat surface of said circuit board, and a power is supplied to said electronic components from said DC—DC converter through the wiring in the power supply plane of said circuit board.

16. The disk array system according to claim 15,
wherein said DC—DC converter is connected and fixed obliquely above and adjacent to said electronic components as the power supply targets on the connection flat surface of said heat sink.

17. The disk array system according to claim 1, further comprising a DC—DC converter for performing the power supply to the electronic components on said circuit board,
wherein said DC—DC converter is installed on the surface on the opposite side with the connection flat surface of the base part of said heat sink in the vicinity of said electronic components as the power supply targets, and
a power is supplied to said electronic components from said DC—DC converter through an opening and a power supply line provided in said heat sink.

18. The disk array system according to claim 17,
wherein said DC—DC converter is arranged almost right above said electronic components as the power supply targets.

19. The disk array system according to claim 17,
wherein said DC—DC converter and said electronic components as the power supply targets are connected by a first connector for the power supply output from said DC—DC converter,
the base part of said heat sink and the power supply line on said circuit board side are connected by a second connector for the power supply input to said DC—DC converter, and
said DC—DC converter, said first connector, and said second connector are connected through a power supply/ground wiring on said heat sink side.

20. The disk array system according to claim 17,
wherein said heat sink has a space for installing said DC—DC converter on a flat surface on which said radiator fins are provided.

* * * * *